US012812967B2

(12) United States Patent
Ishida et al.

(10) Patent No.: US 12,812,967 B2
(45) Date of Patent: Nov. 24, 2026

(54) ENHANCEMENT MOSFET AND SEMICONDUCTOR DEVICE

(71) Applicant: ROHM CO., LTD., Kyoto (JP)

(72) Inventors: Takeshi Ishida, Kyoto (JP); Naoki Izumi, Kyoto (JP); Shoji Takei, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 371 days.

(21) Appl. No.: 18/437,494

(22) Filed: Feb. 9, 2024

(65) Prior Publication Data

US 2024/0290784 A1 Aug. 29, 2024

(30) Foreign Application Priority Data

Feb. 27, 2023 (JP) ................................ 2023-028556

(51) Int. Cl.

| | |
|---|---|
| ***H10D 84/84*** | (2025.01) |
| ***H10D 64/66*** | (2025.01) |
| ***H10D 84/01*** | (2026.01) |
| ***H10D 84/03*** | (2025.01) |
| ***H10P 32/30*** | (2026.01) |

(52) U.S. Cl.

CPC ........... *H10D 84/84* (2025.01); *H10D 64/671* (2025.01); *H10D 84/0135* (2025.01); *H10D 84/0163* (2025.01); *H10D 84/038* (2025.01); *H10P 32/302* (2026.01)

(58) Field of Classification Search

CPC .. H10D 84/84; H10D 64/671; H10D 84/0135; H10D 84/0163; H10D 84/038; H10D 62/343; H10P 32/302

See application file for complete search history.

(56) References Cited

U.S. PATENT DOCUMENTS 4,640,844 A * 2/1987 Neppl .................. H10D 64/663 204/192.15
5,480,830 A * 1/1996 Liao ................... H10D 84/0165 438/585
5,532,178 A * 7/1996 Liaw .................... H10D 89/811 438/231
5,569,624 A * 10/1996 Weiner ............... H10D 30/0227 257/E21.151
6,060,360 A * 5/2000 Lin .................... H10D 30/0411 257/E21.422

FOREIGN PATENT DOCUMENTS

JP H06-282338 A 10/1994

* cited by examiner

*Primary Examiner* — Matthew L Reames

(74) *Attorney, Agent, or Firm* — Rabin & Berdo, P.C.

(57) ABSTRACT

An enhancement type MOSFET includes: a semiconductor layer having a first main surface on one side and a second main surface on another side, and having a p-type region in a surface layer region on the side of the first main surface; an n-type source region and an n-type drain region formed at an interval from each other in a surface layer region of the p-type region; a channel region formed between the n-type source region and the n-type drain region; a gate insulating film disposed on the channel region; and a polysilicon gate formed on the gate insulating film, wherein at least a main portion of the polysilicon gate is made of non-doped polysilicon.

14 Claims, 30 Drawing Sheets

$P^+$ ions implanted $B^+$ ions implanted $B^+$ ions implanted $P^+$ ions implanted B$^+$ ions implanted

ENHANCEMENT MOSFET AND SEMICONDUCTOR DEVICE

CROSS-REFERENCE TO RELATED APPLICATION

This application is based upon and claims the benefit of priority from Japanese Patent Application No. 2023-028556, filed on Feb. 27, 2023, the entire contents of which are incorporated herein by reference.

TECHNICAL FIELD

The present disclosure relates to an enhancement type metal-oxide semiconductor field-effect transistor (MOSFET) and a semiconductor device.

BACKGROUND

In the related art, a constant current circuit is known as a circuit including a reference voltage generation circuit. The constant current circuit includes a reference voltage generation circuit configured by a depletion (DEN) type MOSFET and an enhancement (EN) type MOSFET, an operational amplifier to which a signal outputted from the reference voltage generation circuit is inputted, a transistor to which the output from the operational amplifier is inputted, and a resistor connected to the source of the transistor.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will be described in detail below with reference to the accompanying drawings.

Figure 1:
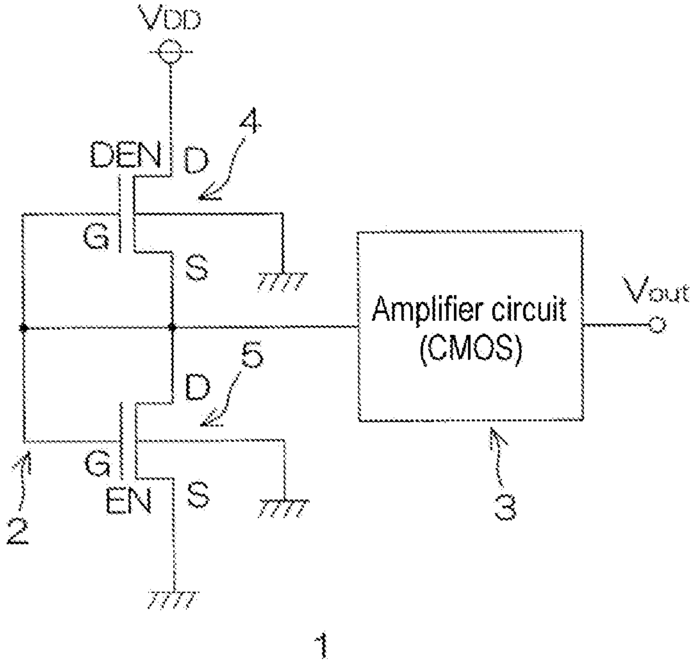
FIG. 1 is a (partial) circuit view of a semiconductor device according to a first embodiment of the present disclosure.

FIG. 1 is a (partial) circuit view of a semiconductor device 1 according to a first embodiment of the present disclosure.

The semiconductor device 1 includes a reference voltage generation circuit 2, and an amplifier circuit 3 as an operating circuit connected to the reference voltage generation circuit 2.

The reference voltage generation circuit 2 includes a depletion type MOSFET 4 (DEN) whose drain (D) is connected to a power supply terminal VDD and whose source(S) and gate (G) are connected to each other, and an enhancement type MOSFET 5 (EN) whose drain (D) and gate (G) are connected to each other and connected to the source of the depletion type MOSFET 4. The back gates of the depletion type MOSFET 4 and the enhancement type MOSFET 5 and the source of the enhancement type MOSFET 5 are fixed to a ground (GNE) potential.

In such a reference voltage generation circuit 2, the constant current of the depletion type MOSFET 4, which always operates at VGS=0 V, is allowed to flow through the enhancement type MOSFET 5 connected in series to the depletion type MOSFET 4, so that the voltage generated in the enhancement type MOSFET 5 is inputted to the amplifier circuit 3 as a reference voltage (Vref), and the voltage amplified by the amplifier circuit 3 is taken out as an output voltage (Vout). The reference voltage Vref is a difference (Vth_E-Vth_D) between the threshold voltage Vth_E of the enhancement type MOSFET 5 and the threshold voltage Vth_D of the depletion type MOSFET 4.

Figure 2:
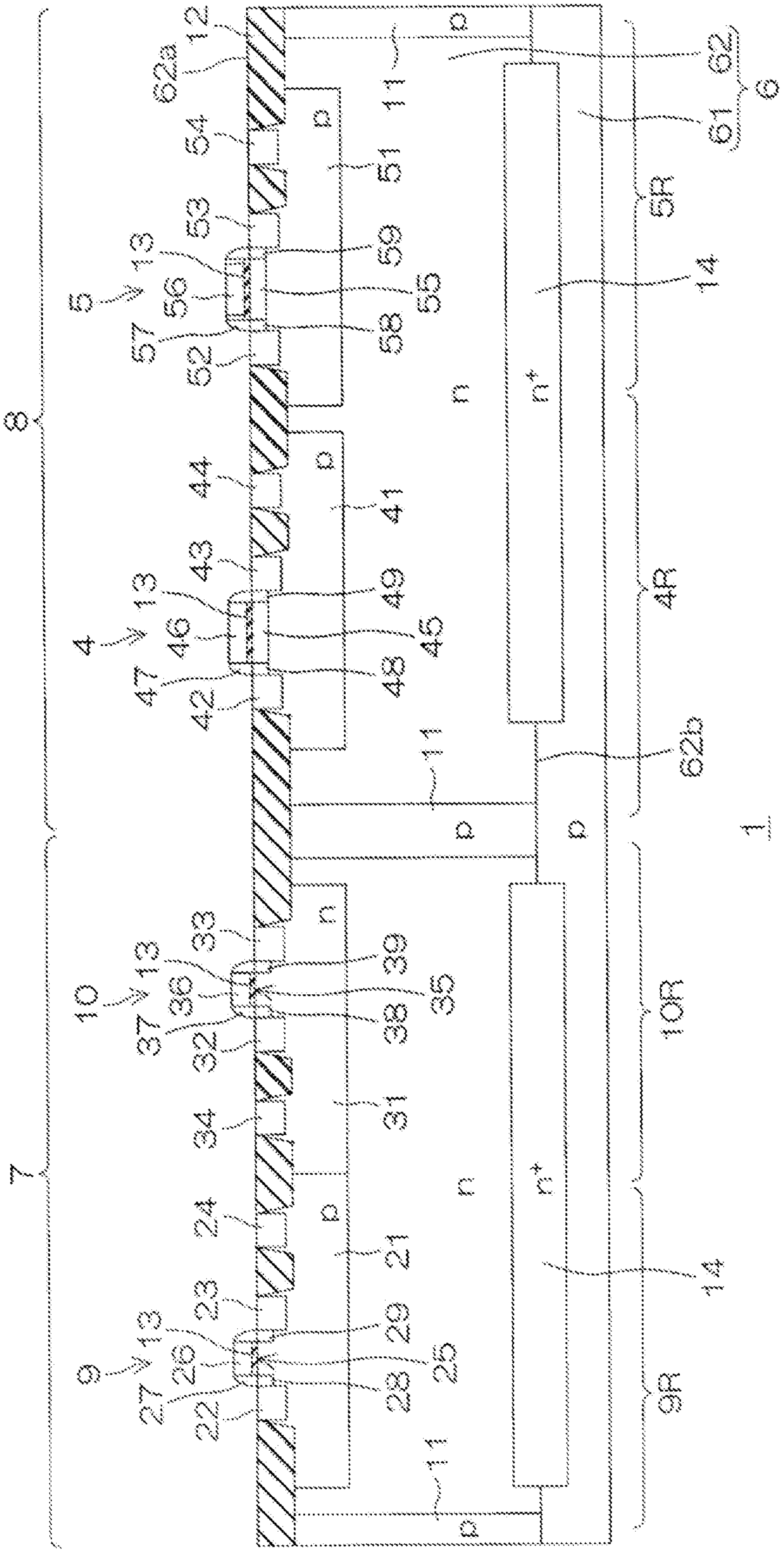
FIG. 2 is a schematic cross-sectional view of the semiconductor device according to the first embodiment of the present disclosure.
Figure 3:
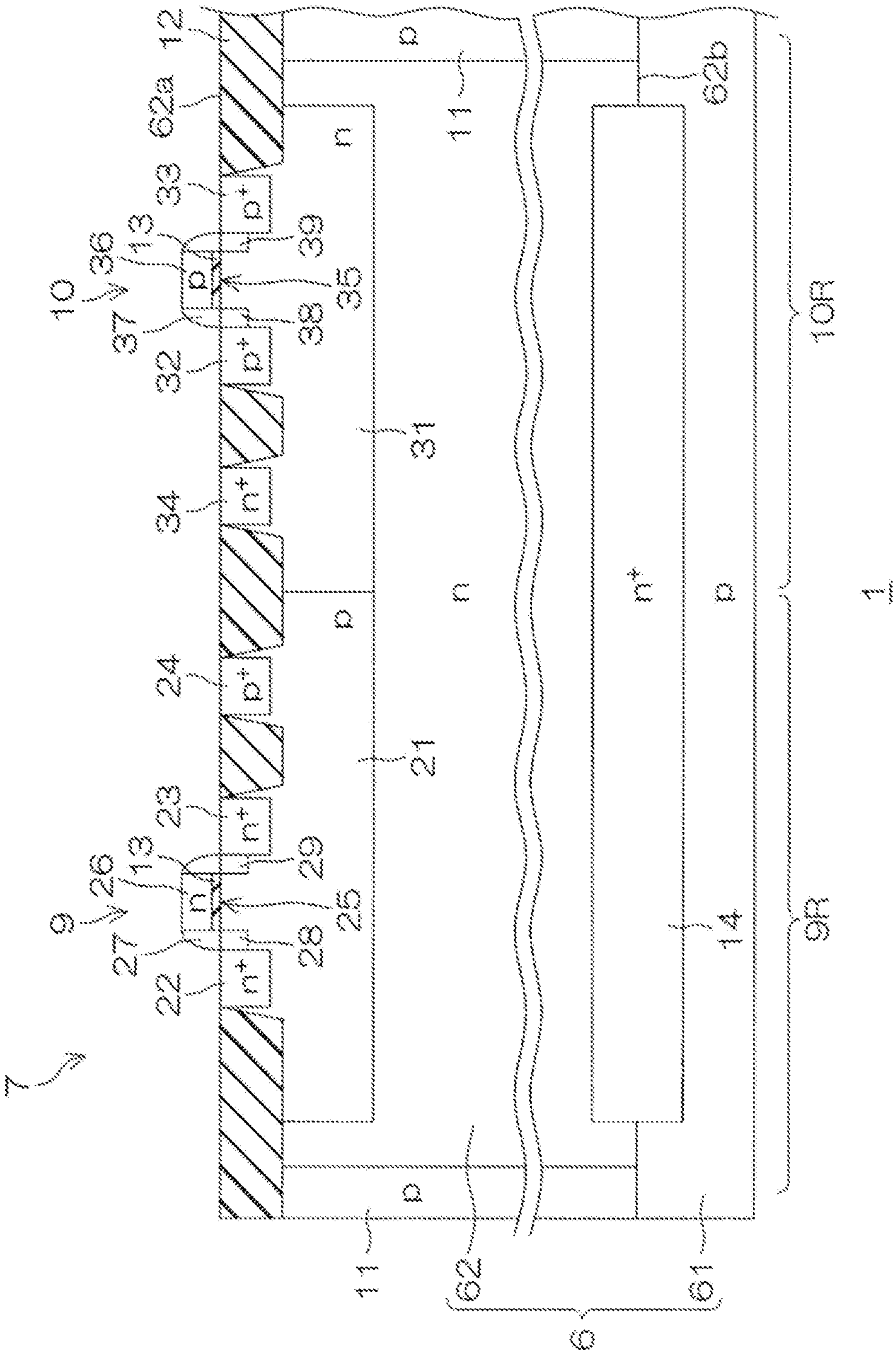
FIG. 3 is an enlarged cross-sectional view showing a CMOS region in FIG. 2.
Figure 4:
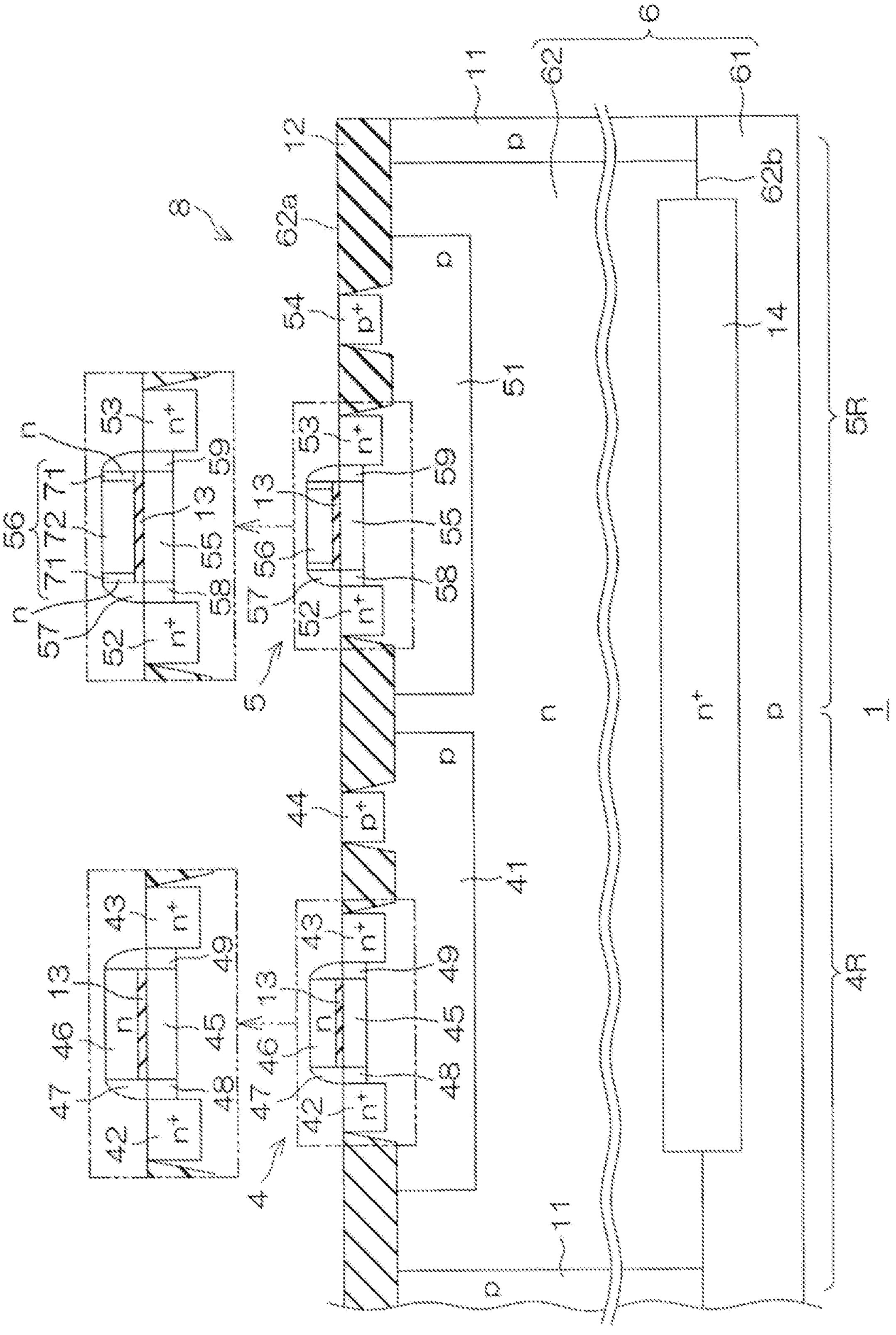
FIG. 4 is an enlarged cross-sectional view showing a Ref circuit region in FIG. 2.

FIG. 2 is a schematic cross-sectional view of the semiconductor device 1 according to the first embodiment of the present disclosure. FIG. 3 is an enlarged cross-sectional view showing a CMOS region 7 in FIG. 2. FIG. 4 is an enlarged cross-sectional view showing a Ref circuit region 8 in FIG. 2.

The semiconductor device 1 includes a p-type semiconductor substrate 6 made of, for example, silicon, a CMOS region 7 as an operating circuit region set in the semiconductor substrate 6, and a Ref (Reference) circuit region 8 as a reference circuit region set in the semiconductor substrate 6. The CMOS region 7 and the Ref circuit region 8 are set on the common semiconductor substrate 6.

An n-type MOSFET 9 and a p-type MOSFET 10 as operational MOSFETs are formed in the CMOS region 7. These MOSFETs 9 and 10 constitute the amplifier circuit 3 shown in FIG. 1. On the other hand, a depletion type MOSFET 4 and an enhancement type MOSFET 5 are formed in the Ref circuit region 8. These MOSFETs 4 and 5 constitute the reference voltage generation circuit 2 shown in FIG. 1.

In this embodiment, the semiconductor substrate 6 includes a base substrate 61, and an n-type epitaxial layer 62 as an example of a semiconductor layer. Although the base substrate 61 is made of a silicon (Si) substrate in this embodiment, it may be a substrate made of another material (e.g., silicon carbide (SiC) or the like). The base substrate 61 is p-type in this embodiment. The base substrate 61 may have an impurity concentration of, for example, $1\times10^{15}$ $cm^{-3}$ or more and $1\times10^{18}$ $cm^{-3}$ or less. Further, the thickness of the base substrate 61 may be 100 μm or more and 500 μm or less.

The n-type epitaxial layer 62 is in contact with the base substrate 61 and is laminated on the base substrate 61. The n-type epitaxial layer 62 has a first main surface 62*a* on the opposite side to the base substrate 61 side, and a second main surface 62*b* on the base substrate 61 side. In this embodiment, the n-type epitaxial layer 62 has a conductivity type opposite to that of the base substrate 61, and is n-type. The n-type epitaxial layer 62 may have an impurity concentration of, for example, $1\times10^{15}$ $cm^{-3}$ or more and $1\times10^{17}$ $cm^{-3}$ or less. Further, the thickness of the n-type epitaxial layer 62 may be 2 μm or more and 15 μm or less.

In the semiconductor substrate 6, an element isolation portion 11 including a p-type element isolation well is formed in order to secure the CMOS region 7 and the Ref circuit region 8. Further, in the semiconductor substrate 6, a field insulating film 12 (element isolation film) as an element isolation portion made of an insulating material such as silicon oxide or the like is formed in order to secure regions 4R, 5R, 9R and 10R for the MOSFETs 4, 5, 9 and 10.

A gate insulating film 13 is formed in a region of the semiconductor substrate 6 defined by the field insulating film 12.

An n-type buried layer 14 is formed in each of the CMOS region 7 and the Ref circuit region 8. The n-type buried layer 14 is formed so as to straddle the boundary between the base substrate 61 and the n-type epitaxial layer 62. The n-type buried layer 14 has a higher n-type impurity concentration than the n-type epitaxial layer 62. The thickness of the n-type buried layer 14 may be 1 μm or more and 5 μm or less.

In the CMOS region 7, the n-type MOSFET 9 includes a p-type well 21, an n-type source region 22, an n-type drain region 23, and a p-type back gate region 24.

The p-type well 21 is formed in a surface layer region of the n-type epitaxial layer 62 on the first main surface 62*a* side. The n-type source region 22 and the n-type drain region 23 are formed in a surface layer region of the p-type well 21 at an interval. The n-type source region 22 and the n-type drain region 23 have a higher n-type impurity concentration than the n-type epitaxial layer 62.

The p-type back gate region 24 is a surface layer region of the p-type well 21, and is formed in a region on the opposite side of the n-type drain region 23 from the n-type source region 22 in a spaced-apart relationship with the n-type drain region 23. The p-type back gate region 24 has a higher p-type impurity concentration than the p-type well 21.

A polysilicon gate 26 is formed to face a channel region 25 between the n-type source region 22 and the n-type drain region 23 with the gate insulating film 13 interposed between the n-type source region 22 and the n-type drain region 23. Both sides of the polysilicon gate 26 are covered with sidewalls 27 made of an insulating material such as silicon oxide or the like. The polysilicon gate 26 is made of conductive polysilicon containing an n-type impurity. The n-type impurity is P (phosphorus) in this embodiment. That is, the polysilicon gate 26 is made of n-type polysilicon. The polysilicon gate 26 may be referred to as n-type polysilicon gate 26.

N-type low concentration layers 28 and 29 are formed between the n-type source region 22 and the n-type drain region 23 and the polysilicon gate 26, i.e., in the region directly under the sidewalls 27. In this way, an LDD structure is formed. The n-type low concentration layers 28 and 29 are regions formed to have a lower concentration than the n-type source region 22 and the n-type drain region 23 and formed by implanting impurity ions more shallowly than in the n-type source region 22 and the n-type drain region 23.

The n-type low concentration layers 28 and 29 are formed in a self-aligned manner with respect to the polysilicon gate 26, and the n-type source region 22 and the n-type drain region 23 are formed in a self-aligned manner with respect to the sidewalls 27. The n-type low concentration layers 28 and 29 relax an electric field in the vicinity of the n-type drain region 23 and suppress a hot electron effect.

In the CMOS region 7, the p-type MOSFET 10 includes an n-type well 31, a p-type source region 32, a p-type drain region 33, and an n-type back gate region 34.

The n-type well 31 is formed in a surface layer region of the n-type epitaxial layer 62 on the side of the first main surface 62*a*. The p-type source region 32 and the p-type drain region 33 are formed in a surface layer region of the n-type well 31 at an interval.

The n-type back gate region 34 is a surface layer region of the n-type well 31 and is formed in a region on the opposite side of the p-type source region 32 from the p-type drain region 33 in a spaced-apart relationship with the p-type source region 32. The n-type back gate region 34 has a higher n-type impurity concentration than the n-type well 31.

A polysilicon gate 36 is formed to face a channel region 35 between the p-type source region 32 and the p-type drain region 33 with the gate insulating film 13 interposed between the p-type source region 32 and the p-type drain region 33. Both sides of the polysilicon gate 36 are covered with sidewalls 37 made of an insulating material such as silicon oxide or the like. The polysilicon gate 36 is made of conductive polysilicon containing a p-type impurity. The p-type impurity is B (boron) in this embodiment. That is, the polysilicon gate 36 is made of p-type polysilicon. The polysilicon gate 36 may be referred to as p-type polysilicon gate 36.

P-type low concentration layers 38 and 39 are formed between the p-type source region 32 and the p-type drain region 33 and the polysilicon gate 36, i.e., in the region directly under the sidewalls 37. In this way, an LDD structure is formed. The p-type low concentration layers 38 and 39 are regions formed to have a lower concentration than the p-type source region 32 and the p-type drain region 33, and are formed by implanting impurity ions more shallowly than in the p-type source region 32 and the p-type drain region 33.

The p-type low concentration layers 38 and 39 are formed in a self-aligned manner with respect to the polysilicon gate 36, and the p-type source region 32 and the p-type drain region 33 are formed in a self-aligned manner with respect to the sidewalls 37. The p-type low concentration layers 38 and 39 relax an electric field in the vicinity of the p-type drain region 33 and suppress a hot electron effect.

In the Ref circuit region 8, the depletion type MOSFET 4 includes a p-type well 41, an n-type source region 42, an n-type drain region 43, and a p-type back gate region 44. The p-type well 41 is an example of a "first p-type region" of the present disclosure. The n-type source region 42 is an example of a "first (n-type) source region" of the present disclosure. The n-type drain region 43 is an example of a "first (n-type) drain region" of the present disclosure.

The p-type well 41 is formed in a surface layer region of the n-type epitaxial layer 62 on the side of the first main surface 62*a*. The n-type source region 42 and the n-type drain region 43 are formed in a surface layer region of the p-type well 41 at an interval. The n-type source region 42 and the n-type drain region 43 have a higher n-type impurity concentration than the n-type epitaxial layer 62.

The p-type back gate region 44 is formed in the surface layer region of the p-type well 41 on the opposite side of the n-type drain region 43 from the n-type source region 42 in a spaced-apart relationship with the n-type drain region 43. The p-type back gate region 44 has a higher p-type impurity concentration than the p-type well 41.

A polysilicon gate 46 is formed to face a channel region 45 between the n-type source region 42 and the n-type drain region 43 with the gate insulating film 13 interposed between the n-type source region 42 and the n-type drain region 43. Both sides of the polysilicon gate 46 are covered with sidewalls 47 made of an insulating material such as silicon oxide or the like. An n-type impurity is implanted into the channel region 45. The polysilicon gate 46 is made of conductive polysilicon containing an n-type impurity. The n-type impurity is P (phosphorus) in this embodiment. That is, the polysilicon gate 46 is made of n-type polysilicon. The polysilicon gate 46 may be referred to as n-type polysilicon gate 46.

The channel region 45 is an example of a "first channel region" of the present disclosure. The polysilicon gate 46 is an example of a "first polysilicon gate" of the present disclosure. The gate insulating film 13 below the polysilicon gate 46 is an example of a "first gate insulating film" of the present disclosure. The sidewalls 47 are an example of "first sidewalls" of the present disclosure.

N-type low concentration layers 48 and 49 are formed between the n-type source region 42 and the n-type drain region 43 and the polysilicon gate 46, i.e., in the region directly under the sidewalls 47. In this way, an LDD structure is formed. The n-type low concentration layers 48 and 49 are regions formed to have a lower concentration than the n-type source region 42 and the n-type drain region 43, and are formed by implanting impurity ions more shallowly than in the n-type source region 42 and the n-type drain region 43.

The n-type low concentration layers 48 and 49 are formed in a self-aligned manner with respect to the polysilicon gate 46, and the n-type source region 42 and the n-type drain region 43 are formed in a self-aligned manner with respect to the sidewalls 47. The n-type low concentration layers 48 and 49 relax an electric field near the n-type drain region 43 and suppress a hot electron effect.

In the Ref circuit region 8, the enhancement type MOSFET 5 includes a p-type well 51, an n-type source region 52 as a second source region, an n-type drain region 53 as a second drain region, and a p-type back gate region 54.

The p-type well 51 is an example of a "p-type region" and a "second p-type region" of the present disclosure. The n-type source region 52 is an example of an "n-type source region" and a "second source region" of the present disclosure. The n-type drain region 43 is an example of an "n-type drain region" and a "second drain region" of the present disclosure.

The p-type well 51 is formed in a surface layer region of the n-type epitaxial layer 62 on the first main surface 62*a* side in a spaced-apart relationship with the p-type well 41 of the depletion type MOSFET 4. The n-type source region 52 and the n-type drain region 53 are formed in a surface layer region of the p-type well 51 at an interval. The n-type source region 52 and the n-type drain region 53 have a higher n-type impurity concentration than the n-type epitaxial layer 62.

The p-type back gate region 54 is formed in the surface layer region of the p-type well 51 on the opposite side of the n-type drain region 53 from the n-type source region 52 in a spaced-apart relationship with the n-type drain region 53. The p-type back gate region 54 has a higher p-type impurity concentration than the p-type well 51.

A polysilicon gate 56 is formed to face a channel region 55 between the n-type source region 52 and the n-type drain region 53 with the gate insulating film 13 interposed therebetween. Both sides of the polysilicon gate 46 are covered with sidewalls 57 made of an insulating material such as silicon oxide or the like. The channel region 55 is doped with an n-type impurity. The n-type impurity concentration in the channel region 55 is equal to the n-type impurity concentration in the channel region 45 of the depletion type MOSFET 4.

The channel region 55 is an example of a "second channel region" of the present disclosure. The polysilicon gate 56 is an example of a "polysilicon gate" and a "second polysilicon gate" of the present disclosure. The gate insulating film 13 below the polysilicon gate 56 is an example of a "second gate insulating film" of the present disclosure. The sidewalls 57 are an example of "second sidewalls" of the present disclosure.

The main portion of the polysilicon gate 56 is made of non-doped polysilicon. The main portion of the polysilicon gate 56 refers to a region that occupies 80% or more of the portion of the polysilicon gate 56 facing the channel region 55. Furthermore, the non-doped polysilicon refers to polysilicon having an impurity concentration of $1\times10^{14}$ $cm^{-3}$ or less.

In this embodiment, the polysilicon gate 56 includes n-type portions 71 arranged on both sides of the polysilicon gate 56 and made of n-type polysilicon, and a non-doped portion 72 arranged between the n-type portions 71 and made of non-doped polysilicon. The n-type impurity contained in the n-type portion 71 is P (phosphorus) in this embodiment. In this embodiment, the non-doped portion 72 corresponds to the main portion. The entire polysilicon gate 56 may be made of non-doped polysilicon.

N-type low concentration layers 58 and 59 are formed between the n-type source region 52 and the n-type drain region 53 and the polysilicon gate 46, i.e., in the region directly under the sidewalls 57. In this way, an LDD structure is formed. The n-type low concentration layers 58 and 59 are regions formed to have a lower concentration than the n-type source region 52 and the n-type drain region 53, and are formed by implanting impurity ions more shallowly than in the n-type source region 52 and the n-type drain region 53.

The n-type low concentration layers 58 and 59 are formed in a self-aligned manner with respect to polysilicon gate 56, and the n-type source region 52 and the n-type drain region 53 are formed in a self-aligned manner with respect to the sidewalls 57. The n-type low concentration layers 58 and 59 relax an electric field near the n-type drain region 53 and suppress a hot electron effect.

In the first embodiment, in the Ref circuit region 8, the impurity concentration of the channel region 45 of the depletion type MOSFET 4 and the impurity concentration of the channel region 55 of the enhancement type MOSFET 5 are equal to each other. On the other hand, the main portion of the polysilicon gate 46 of the depletion type MOSFET 4 is made of n-type polysilicon, whereas the main portion of the polysilicon gate 56 of the enhancement type MOSFET 5 is made of non-doped polysilicon.

Thus, there is a difference between the work function difference between the polysilicon gate 46 and the channel region 45 in the depletion type MOSFET 4 and the work function difference between the polysilicon gate 56 and the channel region 55 in the enhancement type MOSFET 5. Therefore, the threshold voltage Vth_D of the depletion type MOSFET 4 and the threshold voltage Vth_E of the enhancement type MOSFET 5 are made different. For example, the threshold voltage Vth_D is −1.0 V to −0.2 V, and the threshold voltage Vth_E is 0.2 V to 1.0 V. In FIG. 1, a voltage corresponding to the threshold voltage difference (Vth_E-Vth_D) can be sent to the amplifier circuit 3.

Although not shown, an interlayer insulating film that collectively covers the respective polysilicon gates 26, 36, 46 and 56 is laminated on the semiconductor substrate 6. Although not shown, on the interlayer insulating film, there are formed a plurality of source electrodes corresponding to the plurality of source regions 22, 32, 42 and 52, respectively, a plurality of drain electrodes corresponding to the plurality of drain regions 23, 33, 43 and 53, respectively, and a plurality of back gate electrodes corresponding to the plurality of back gate regions 24, 34, 44 and 54, respectively.

Although not shown, in the interlayer insulating film, there are formed vias for connecting the plurality of source regions 22, 32, 42 and 52 to their corresponding source electrodes, vias for connecting the plurality of drain regions 23, 33, 43 and 53 to their corresponding drain electrodes, and vias for connecting the plurality of back gate regions 24, 34, 44 and 54 to their corresponding back gate electrodes. The source electrode of the depletion type MOSFET 4 and the drain electrode of the enhancement type MOSFET 5 are integrally formed and connected on the interlayer insulating film.

Next, a semiconductor device 101 according to a first comparative example (hereinafter simply referred to as "first comparative example 101") will be described. The first comparative example 101 includes a CMOS region and a Ref circuit region just like the semiconductor device 1 according to the first embodiment. The configuration of the CMOS region of the first comparative example 101 is the same as the configuration of the CMOS region 7 of the semiconductor device 1 according to the first embodiment.

Figure 5:
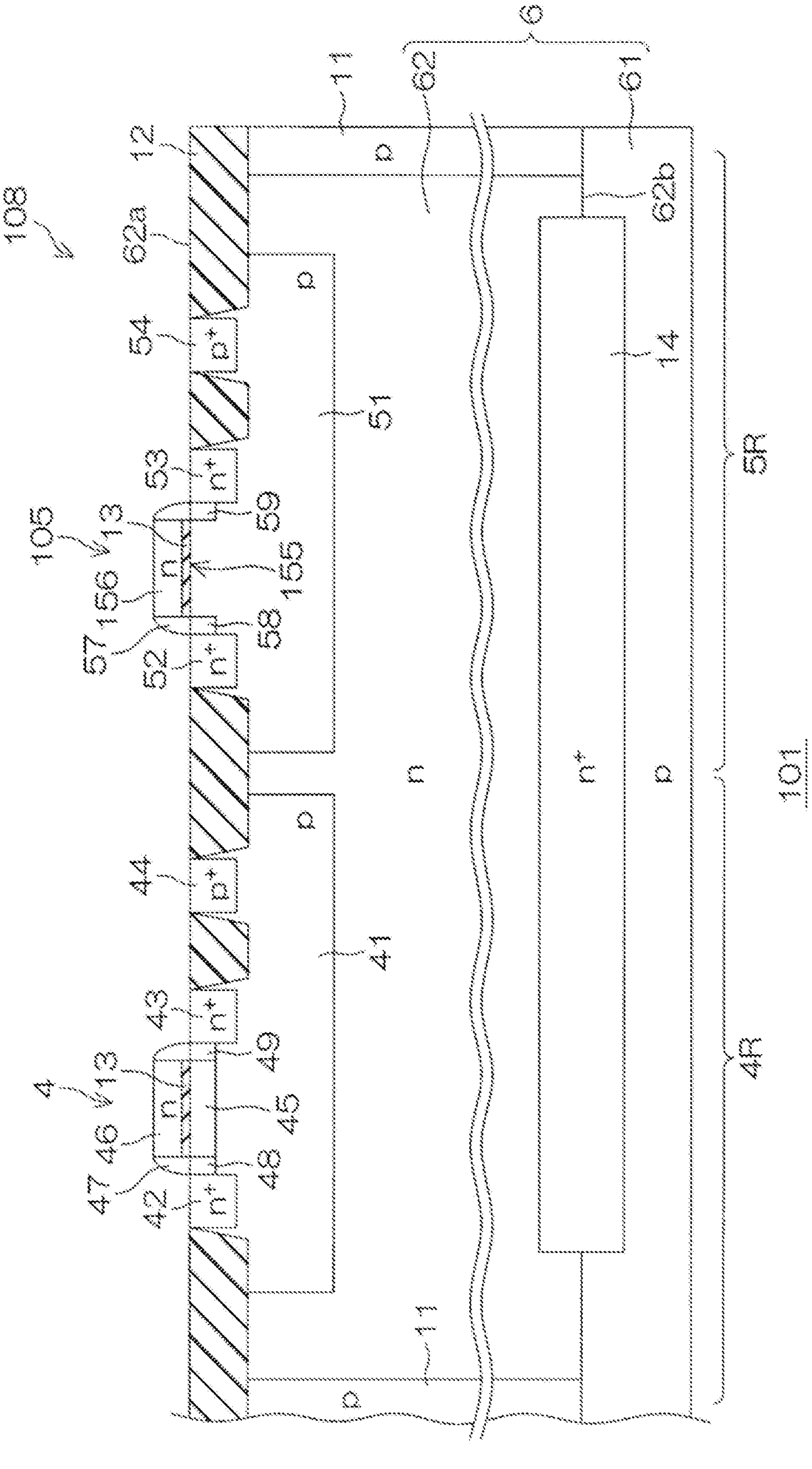
FIG. 5 is a cross-sectional view showing a Ref circuit region in a first comparative example, which corresponds to FIG. 4.

FIG. 5 is a cross-sectional view showing a Ref circuit region 108 in the first comparative example 101, which corresponds to FIG. 4. In FIG. 5, parts corresponding to those shown in FIG. 4 are designated by the same reference numerals as in FIG. 4.

The Ref circuit region 108 of the first comparative example 101 includes a depletion type MOSFET 4 and an enhancement type MOSFET 105. The configuration of the depletion type MOSFET 4 of the first comparative example 101 is the same as the configuration of the depletion type MOSFET 4 of the semiconductor device 1 according to the first embodiment.

The enhancement type MOSFET 105 of the first comparative example 101 differs from the enhancement type MOSFET 5 of the semiconductor device 1 according to the first embodiment in terms of the following points (A1) and (A2).

(A1) In the enhancement type MOSFET 105 of the first comparative example 101, no n-type impurity is implanted into the channel region 155. Therefore, in the first comparative example 101, the n-type impurity concentration of the channel region 45 of the depletion type MOSFET 4 and the n-type impurity concentration of the channel region 155 of the enhancement type MOSFET 105 are different from each other.

(A2) In the enhancement type MOSFET 105 of the first comparative example 101, the polysilicon gate 156 is made of n-type polysilicon. The n-type impurity contained in the polysilicon gate 1562 is P (phosphorus) in this example. That is, in the first comparative example 101, the polysilicon gate 46 of the depletion type MOSFET 4 and the polysilicon gate 156 of the enhancement type MOSFET 105 are both made of n-type polysilicon.

In the first comparative example 101, by providing a difference between the n-type impurity concentration of the channel region 45 of the depletion type MOSFET 4 and the n-type impurity concentration of the channel region 155 of the enhancement type MOSFET 105, the threshold voltage Vth_D of the depletion type MOSFET 4 and the threshold voltage Vth_E of the enhancement type MOSFET 105 are made different from each other.

Figure 6:
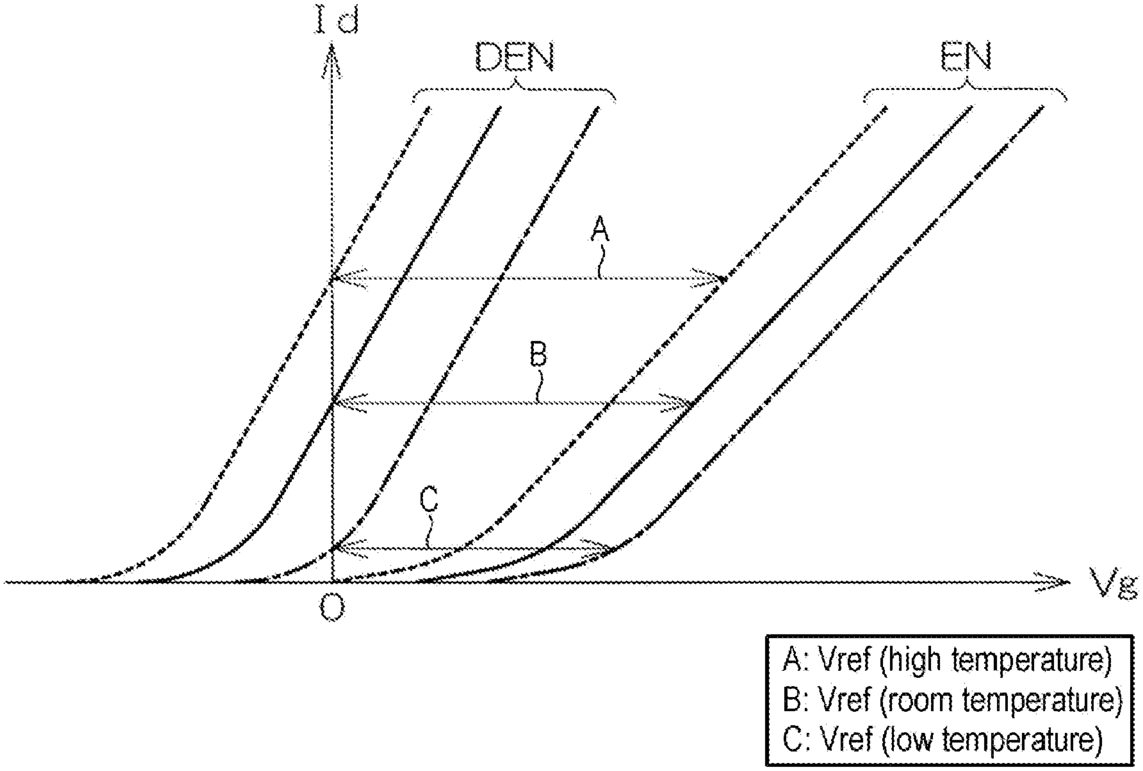
FIG. 6 is a graph showing the Vg-Ig characteristics of a depletion type MOSFET and an enhancement type MOSFET in the first comparative example.

In the first comparative example 101, the n-type impurity concentration of the channel region 45 of the depletion type MOSFET 4 is different from the n-type impurity concentration of the channel region 155 of the enhancement type MOSFET 105. Therefore, as shown in FIG. 6, the slope of the Vg-Id characteristic (gate voltage-drain current characteristic) of the depletion type MOSFET 4 is different from the slope of the Vg-Id characteristic of the enhancement type MOSFET 105. Thus, as shown in FIG. 6, the reference voltage Vref, which is the difference between the two threshold voltages, is changed depending on the temperature.

Next, a semiconductor device 201 according to a second comparative example (hereinafter simply referred to as "second comparative example 201") will be described. The second comparative example 201 includes a CMOS region and a Ref circuit region just like the semiconductor device 1 according to the first embodiment. The configuration of the CMOS region of the second comparative example 201 is the same as the configuration of the CMOS region 7 of the semiconductor device 1 according to the first embodiment.

Figure 7:
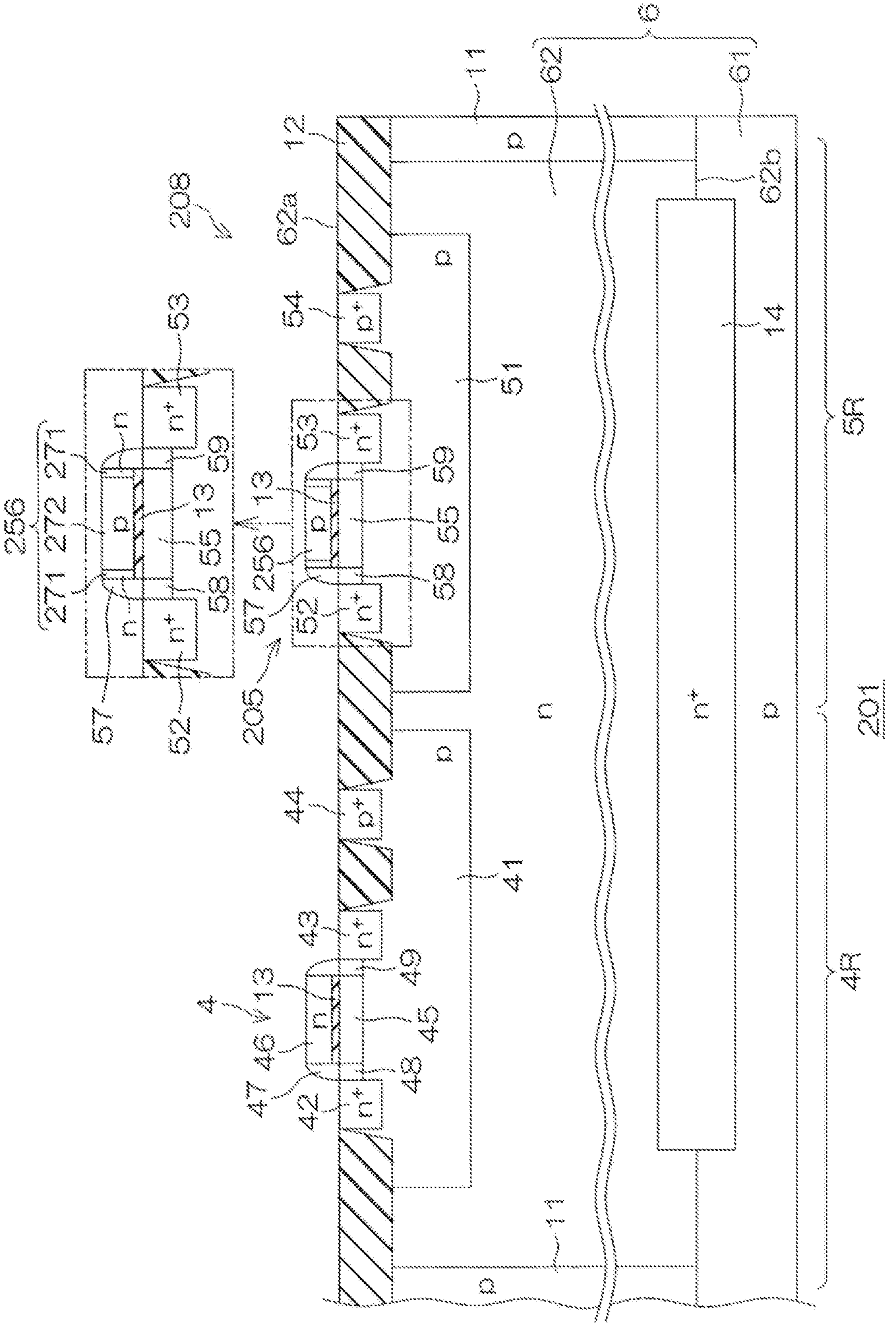
FIG. 7 is a cross-sectional view showing a Ref circuit region in a second comparative example, which corresponds to FIG. 4.

FIG. 7 is a cross-sectional view showing the Ref circuit region 208 in the second comparative example 201, which corresponds to FIG. 4. In FIG. 7, parts corresponding to those shown in FIG. 4 are designated by the same reference numerals as in FIG. 4.

The Ref circuit area 208 of the second comparative example 201 includes a depletion type MOSFET 4 and an enhancement type MOSFET 205. The configuration of the depletion type MOSFET 4 of the second comparative example 201 is the same as the configuration of the depletion type MOSFET 4 of the semiconductor device 1 according to the first embodiment.

The enhancement type MOSFET 205 of the second comparative example 201 differs from the enhancement type MOSFET 105 of the first comparative example 101 in terms of the following points (B1) and (B2).

(B1) In the enhancement type MOSFET 205 of the second comparative example 201, an n-type impurity is implanted into the channel region 55 as in the semiconductor device 1 according to the first embodiment. In the second comparative example 201, as in the semiconductor device 1 according to the first embodiment, the impurity concentration of the channel region 55 of the enhancement type MOSFET 205 is equal to the impurity concentration of the channel region 45 of the depletion type MOSFET 4.

(B2) In the enhancement type MOSFET 205 of the second comparative example 201, the main portion of the polysilicon gate 256 is made of p-type polysilicon instead of n-type polysilicon. Specifically, the polysilicon gate 256 includes n-type portions 271 arranged on both sides of the polysilicon gate 256 and made of n-type polysilicon, and a p-type portion 272 arranged between the n-type portions 271 and made of p-type polysilicon. The p-type impurity contained in the p-type portion 272 is B (boron) in this example. The p-type impurity concentration of the p-type portion 272 is $1\times10^{19}$ $cm^{-3}$ or more.

In the second comparative example 201, there is a difference between the work function of the polysilicon gate 46 in the depletion type MOSFET 4 and the work function of the polysilicon gate 256 in the enhancement type MOSFET 205. Thus, there is a difference between the work function difference between the polysilicon gate 46 and the channel region 45 in the depletion type MOSFET 4 and the work function difference between the polysilicon gate 256 and the channel region 55 in the enhancement type MOSFET 205. Therefore, the threshold voltage Vth_D of the depletion type MOSFET 4 and the threshold voltage Vth_E of the enhancement type MOSFET 5 are made different.

Figure 8:
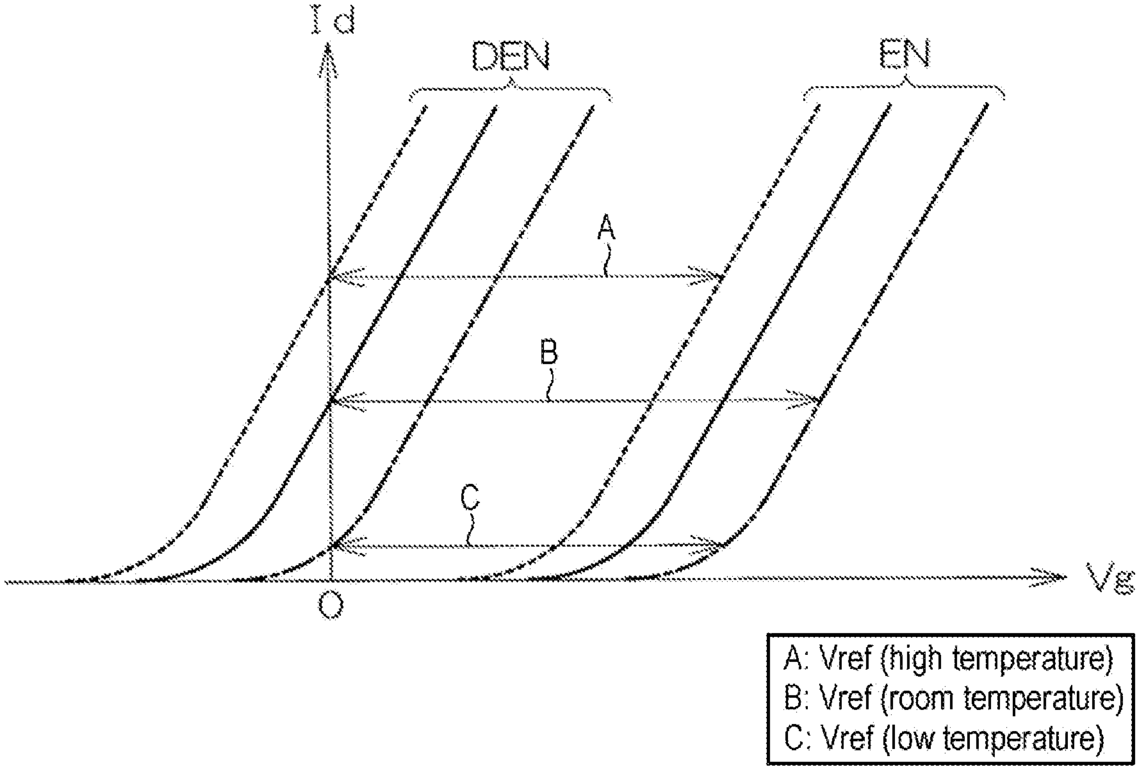
FIG. 8 is a graph showing the Vg-Ig characteristics of a depletion type MOSFET and an enhancement type MOSFET in the second comparative example.

In the second comparative example 201, the n-type impurity concentration of the channel region 255 of the enhancement type MOSFET 205 is equal to the n-type impurity concentration of the channel region 45 of the depletion type MOSFET 4. Therefore, as shown in FIG. 8, the slope of the Vg-Id characteristic of the depletion type MOSFET 4 and the slope of the Vg-Id characteristic of the enhancement type MOSFET 205 are approximately equal to each other. As a result, as shown in FIG. 8, in the second comparative example 201, the change in the reference voltage Vref due to the temperature can be suppressed as compared with the first comparative example 101.

However, in the second comparative example 201, the main portion (p-type portion 272) of the polysilicon gate 256 in the enhancement type MOSFET 205 contains a p-type impurity (boron (B) in this example). Therefore, the following problems may occur. That is, during the manufacturing process or the like, the p-type impurity in the polysilicon gate 256 of the enhancement type MOSFET 205 is diffused, thereby forming fixed charges or trap sites in the gate insulating film 13 or changing the impurity concentration in the channel region 255. As a result, variations in the manufacture and deterioration over time are more likely to occur.

In the semiconductor device 1 according to the first embodiment, the n-type impurity concentration of the channel region 55 of the enhancement type MOSFET 5 is equal to the n-type impurity concentration of the channel region 45 of the depletion type MOSFET 4. As a result, the slope of the Vg-Id characteristic of the depletion type MOSFET 4 and the slope of the Vg-Id characteristic of the enhancement type MOSFET 5 are substantially equal to each other. Therefore, the change in the reference voltage Vref due to the temperature can be suppressed as compared with the first comparative example 101.

Furthermore, in the semiconductor device 1 according to the first embodiment, the main portion (non-doped portion 72) of the polysilicon gate 56 of the enhancement type MOSFET 5 does not contain a p-type impurity. Therefore, as in the second comparative example, the diffusion of the p-type impurity in the polysilicon gate 256 of the enhancement type MOSFET 205 can be suppressed or prevented. Thus, in the semiconductor device 1 according to the first embodiment, variations in the manufacture and deterioration over time are less likely to occur as compared with the second comparative example 201.

FIGS. 9A to 9G are schematic views for describing a part of a process of manufacturing the semiconductor device 1 of FIG. 2 in the order of steps.

Figure 9A:
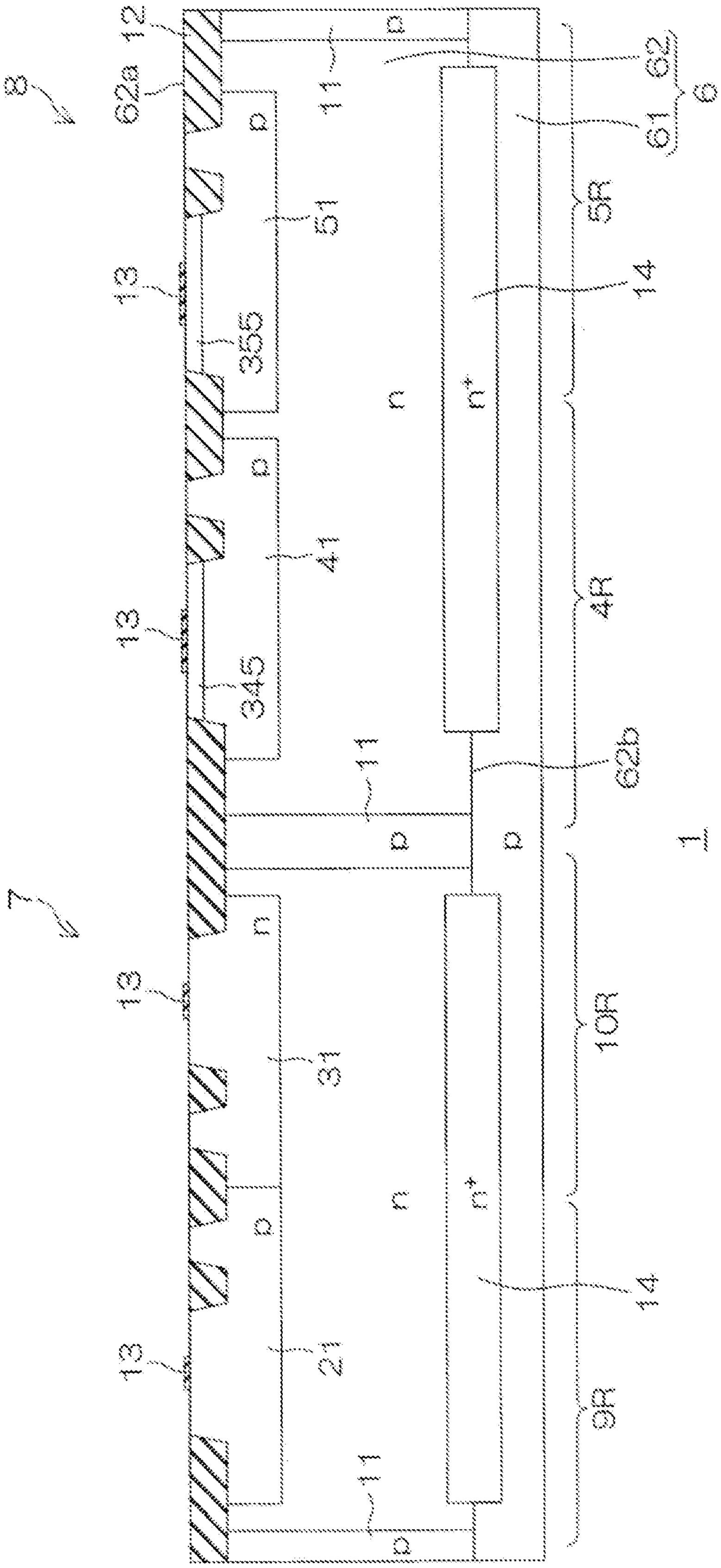
FIG. 9A is a view showing a part of a process of manufacturing the semiconductor device shown in FIG. 2.

First, as shown in FIG. 9A, a semiconductor device including a semiconductor substrate 6, an element isolation portion 11, an n-type buried layer 14, a p-type well 21, an n-type well 31, a p-type well 41, a p-type well 51, n-type impurity diffusion regions 345 and 355 for channel regions 45 and 55, a field insulating film 12, and a gate insulating film 13 is manufactured. The semiconductor substrate 6 includes a base substrate 61 and an n-type epitaxial layer 62 formed on the base substrate 61.

For example, the semiconductor device shown in FIG. 9A is manufactured as follows. That is, first, a p-type base substrate 61 is formed. Next, an n-type impurity and a p-type impurity are selectively implanted into the surface of the base substrate 61. Then, the silicon of the base substrate 61 is epitaxially grown while adding an n-type impurity. As a result, a portion of an n-type epitaxial layer 62 is formed on the p-type base substrate 61.

During the epitaxial growth of the base substrate 61, the n-type impurity and the p-type impurity implanted into the base substrate 61 are diffused in the growth direction of the n-type epitaxial layer 62. As a result, a buried layer 14 is formed at the boundary between the base substrate 61 and the n-type epitaxial layer 62. Further, a portion of the p-type element isolation portion 11 is thereby formed. Thereafter, a p-type impurity is selectively implanted into a portion of the n-type epitaxial layer 62. Then, the silicon of the base substrate 61 is further epitaxially grown while adding an n-type impurity. As a result, a semiconductor substrate 6 including the p-type base substrate 61 and the n-type epitaxial layer 62 is formed.

Thereafter, an n-type well 31 is formed by selectively implanting an n-type impurity into the surface layer region of the n-type epitaxial layer 62. Furthermore, p-type wells 21, 41 and 51 are formed by selectively implanting a p-type impurity into the surface layer region of the n-type epitaxial layer 62. Next, a field insulating biofilm 12 is formed on the semiconductor substrate 6. Next, n-type impurity diffusion regions 345 and 355 are formed by selectively implanting an n-type impurity into the surface layer region of the n-type epitaxial layer 62. Thereafter, a gate insulating film 13 is formed.

Figure 9B:
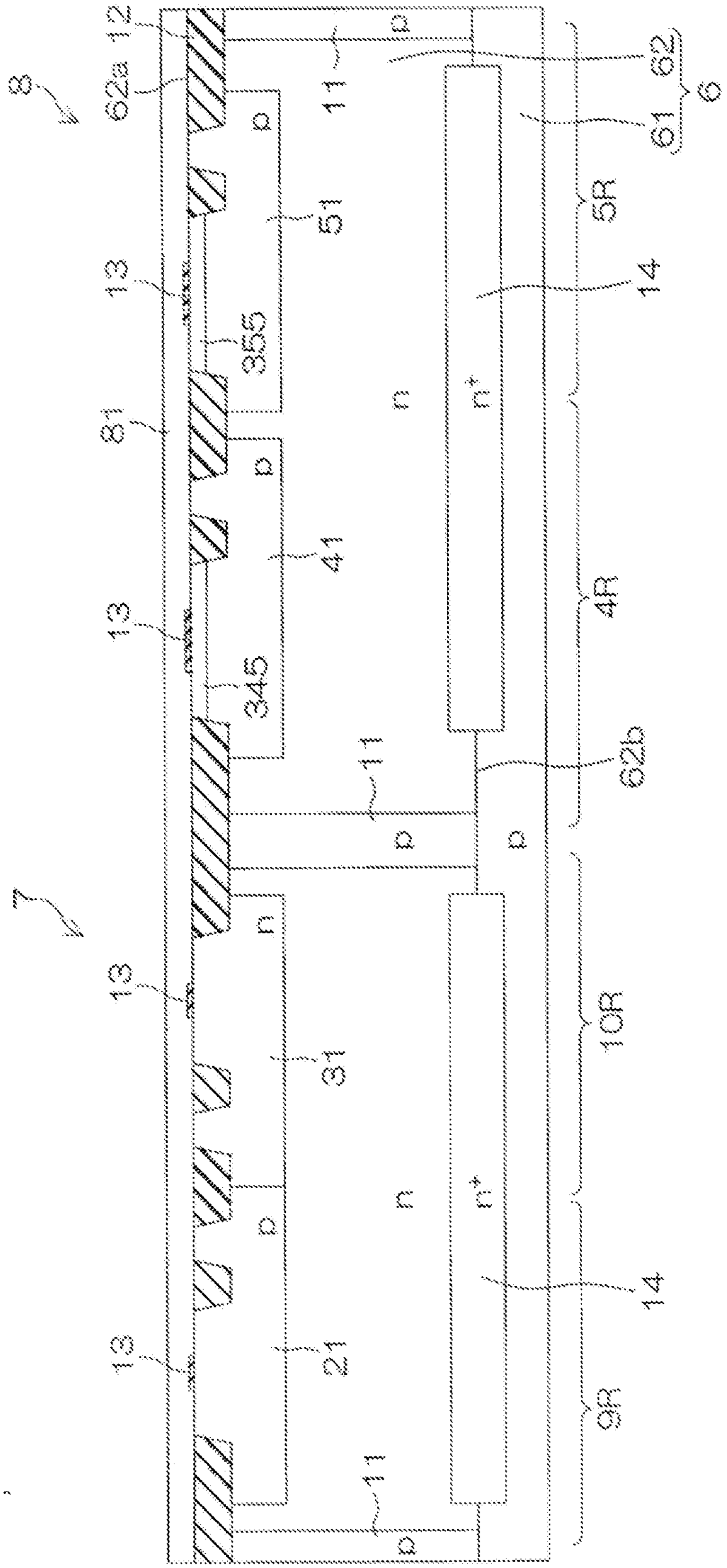
FIG. 9B is a view showing the next step of FIG. 9A.
Figure 9C:
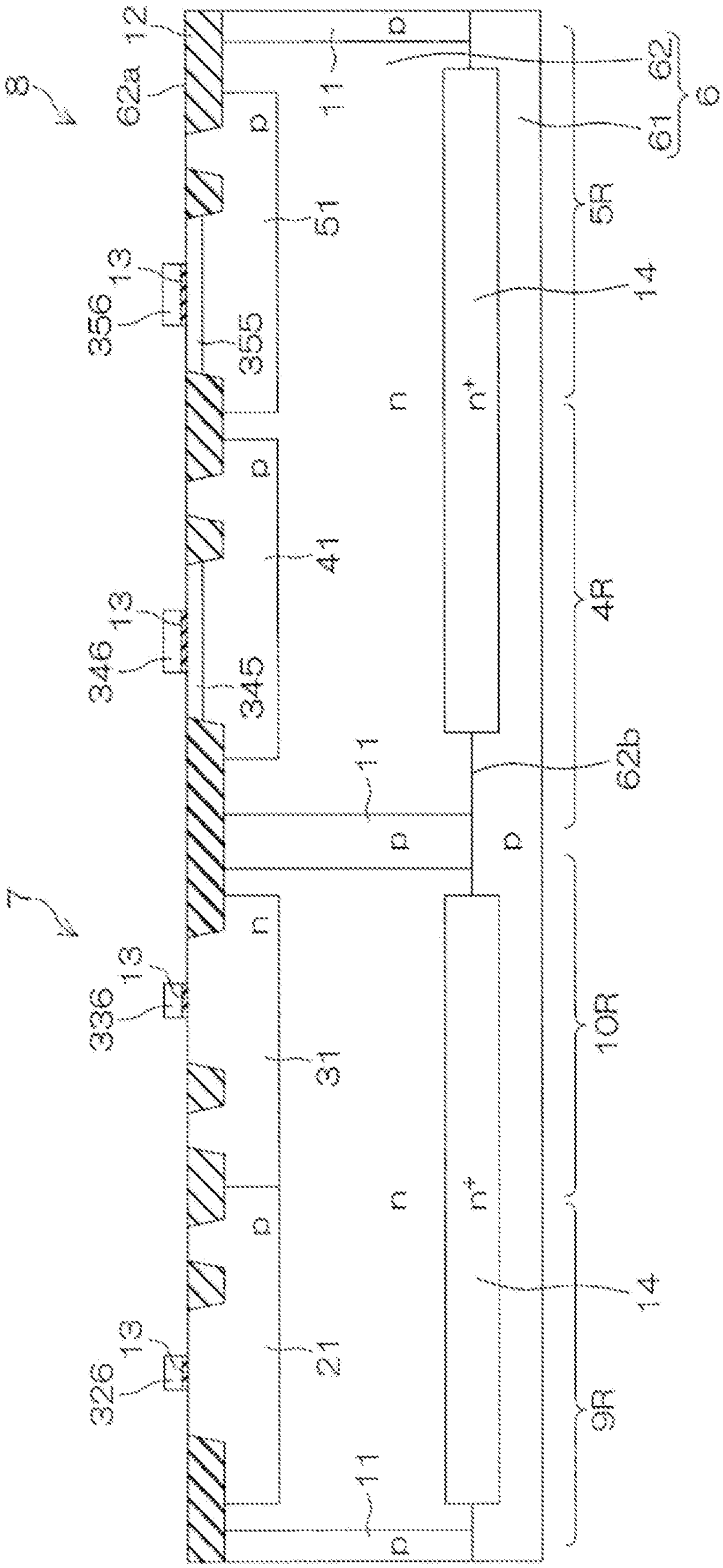
FIG. 9C is a view showing the next step of FIG. 9B.

Next, as shown in FIGS. 9B and 9C, a step of forming non-doped gates 326, 336, 346 and 356 corresponding to polysilicon gates 26, 36, 46 and 56 and made of non-doped polysilicon is performed.

Specifically, first, as shown in FIG. 9B, a non-doped polysilicon film 81 is formed over the entire surface of the semiconductor substrate 6 on the first main surface 62*a* side. Next, a polysilicon film 81 is patterned by photolithography. Thus, as shown in FIG. 9C, non-doped gates 326, 336, 346 and 356 are formed on the corresponding gate insulating films 13.

Figure 9D:
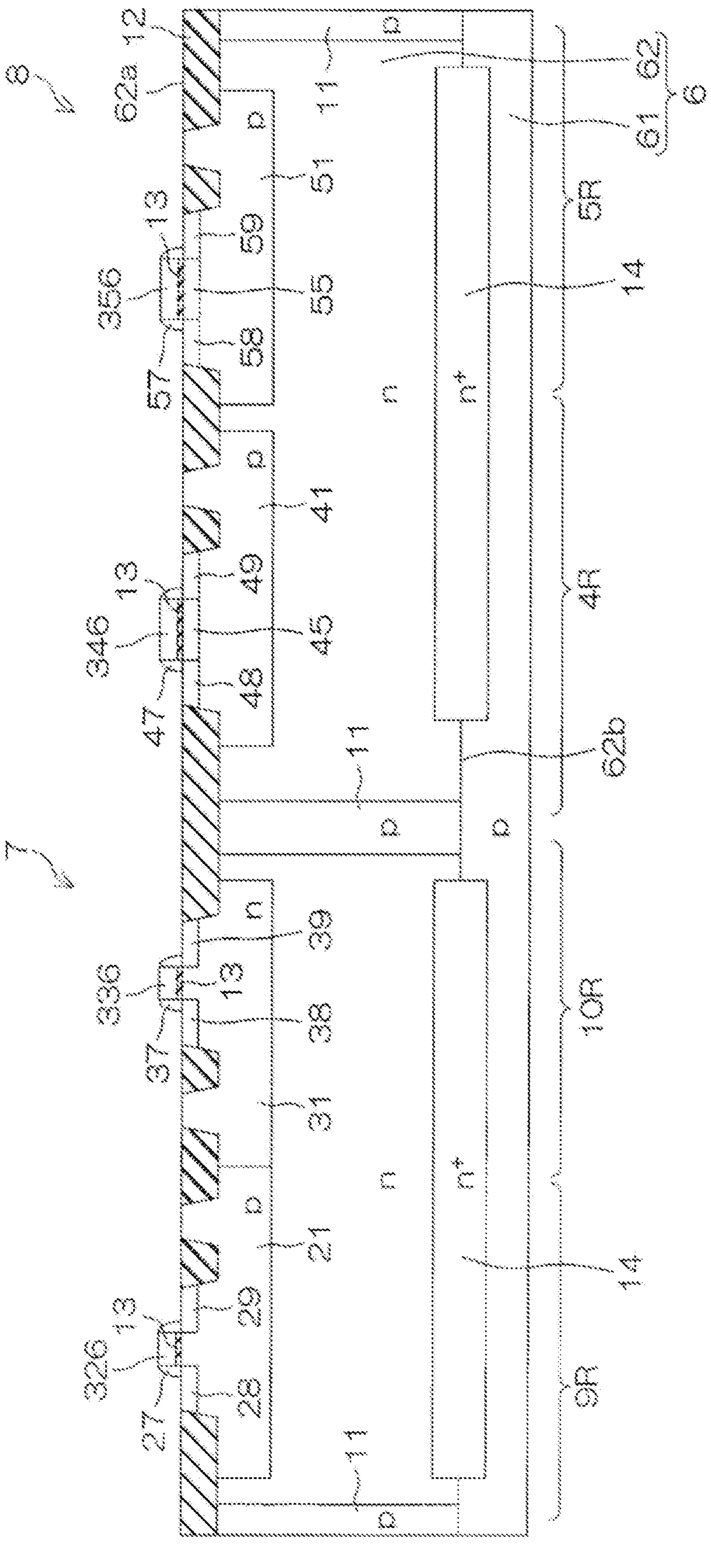
FIG. 9D is a view showing the next step of FIG. 9C.

Next, as shown in FIG. 9D, n-type low concentration layers 28, 29, 48, 49, 58 and 59 are formed in a self-aligned manner with respect to the non-doped gates 326, 346 and 356 by implanting n-type impurity ions (e.g., $P^+$ ions) into the n-type epitaxial layer 62. As a result, channel regions 45 and 55 are formed. Further, p-type low concentration layers 38 and 39 are formed in a self-aligned manner with respect to the non-doped gate 336 by implanting p-type impurity ions (e.g., $B^+$ ions) into the n-type epitaxial layer 62. In order to form the low concentration layers 28, 29, 38, 39, 48, 49, 58 and 59, when implanting ions, the non-doped gate 356 is covered with a resist film.

Next, an insulating film such as a silicon oxide film or the like is formed over the entire surface of the semiconductor substrate 6 on the first main surface 62*a* side by a CVD method, and then the insulating film is etched back by dry etching. By performing the etching-back until the respective non-doped gates 326, 336, 346 and 356 are exposed, sidewalls 27, 37, 47 and 57 are formed on both sides thereof.

Figure 9E:
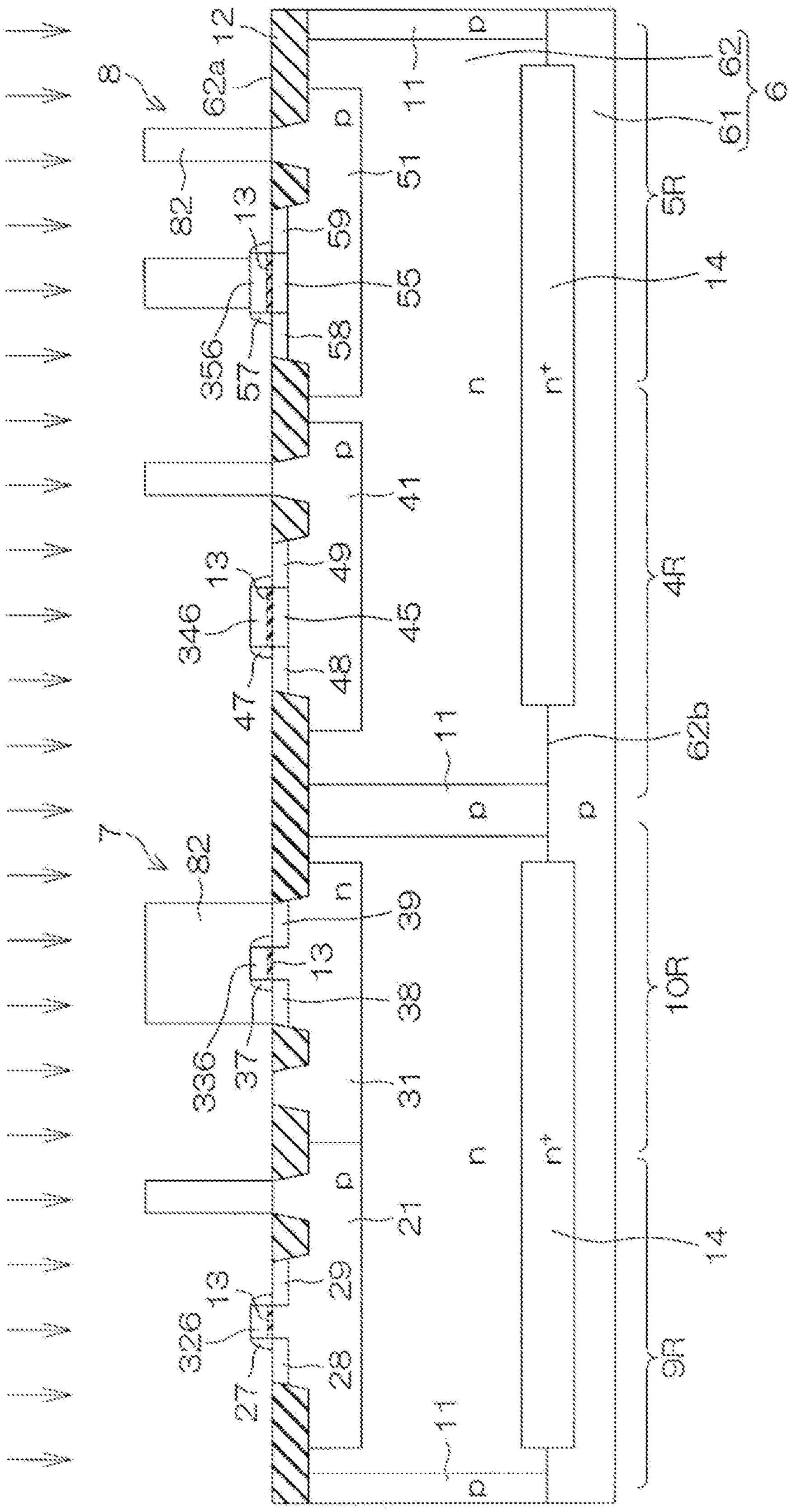
FIG. 9E is a view showing the next step of FIG. 9D.

Next, as shown in FIG. 9E, a resist film 82 is formed so as to cover expected formation regions for the p-type back gate regions 24, 44 and 54, an expected formation region for the p-type source region 32, the non-doped gate 336, the sidewalls 37, an expected formation region for the p-type drain region 33, and a region of the upper surface of the non-doped gate 356 except for both sides of the upper surface of the non-doped gate 356.

Then, n-type impurity ions (e.g., $P^+$ ions) are implanted into the non-doped gates 326 and 346, both sides of the non-doped gate 356, and the n-type epitaxial layer 62 through the resist film 82. Thereafter, the resist film 82 is removed.

Figure 9F:
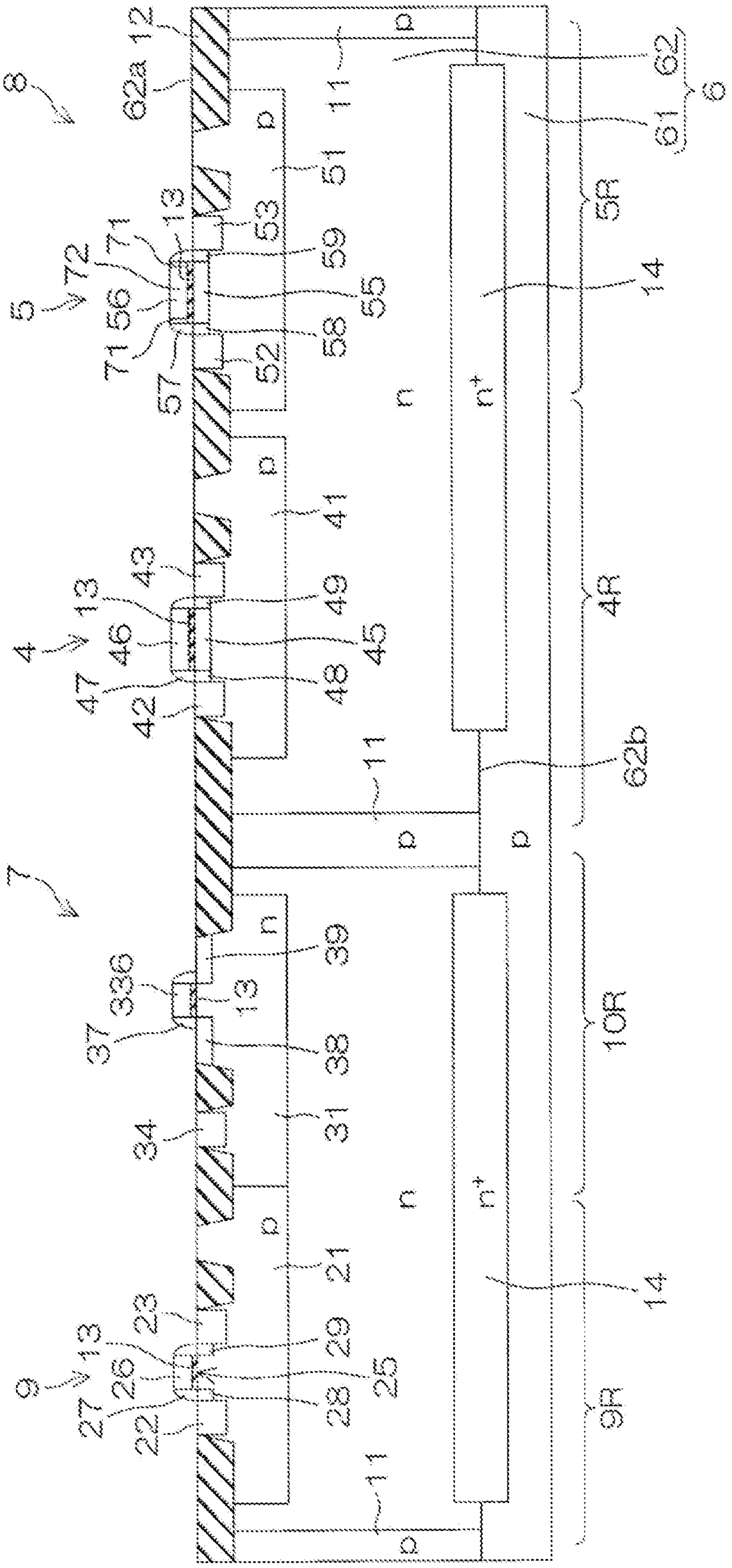
FIG. 9F is a view showing the next step of FIG. 9E.

As a result, as shown in FIG. 9F, n-type source regions 22, 42 and 52, n-type drain regions 23, 43 and 53, an n-type back gate region 34, n-type polysilicon gates 26 and 46, and a polysilicon gate 56 having an n-type portion 71 and a non-doped portion 72 are formed.

Figure 9G:
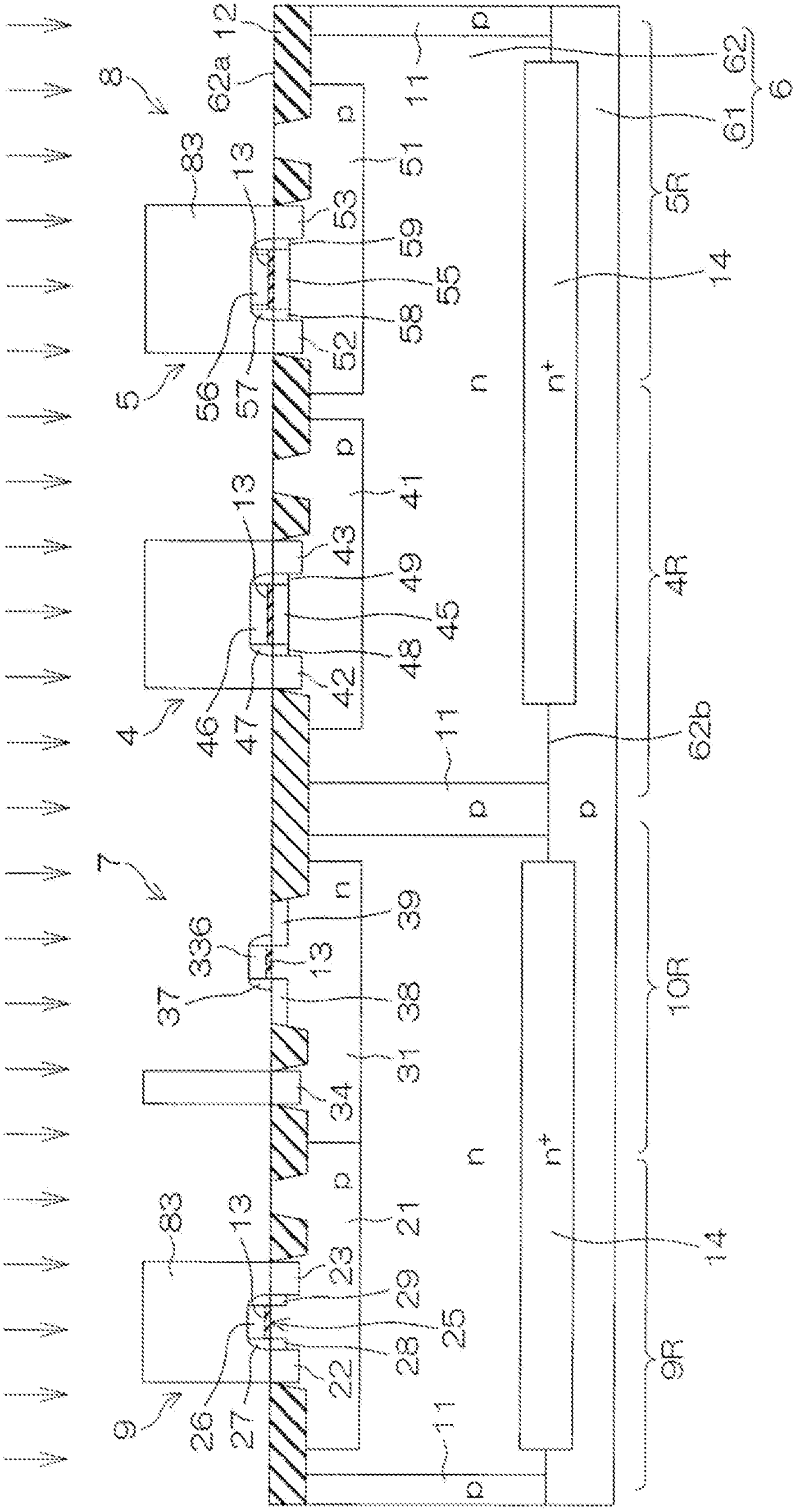
FIG. 9G is a view showing the next step of FIG. 9F.

Next, as shown in FIG. 9G, a resist film 83 is formed to cover each of the n-type source regions 22, 42 and 52, each of the n-type drain regions 23, 43 and 53, the n-type back gate region 34, the n-type polysilicon gates 26 and 46 and the sidewalls 27 and 47 thereof, and the polysilicon gate 56 and the sidewalls 57 thereof. Then, p-type impurity ions (e.g., $B^+$ ions) are implanted into the non-doped gate 336 and the n-type epitaxial layer 62 through the resist film 83. Thereafter, the resist film 83 is removed.

As a result, a p-type polysilicon gate 36, a p-type source region 32, a p-type drain region 33, and p-type back gate regions 24, 44 and 54 are formed. Thus, a semiconductor device 1 as shown in FIG. 2 is obtained.

Figure 10:
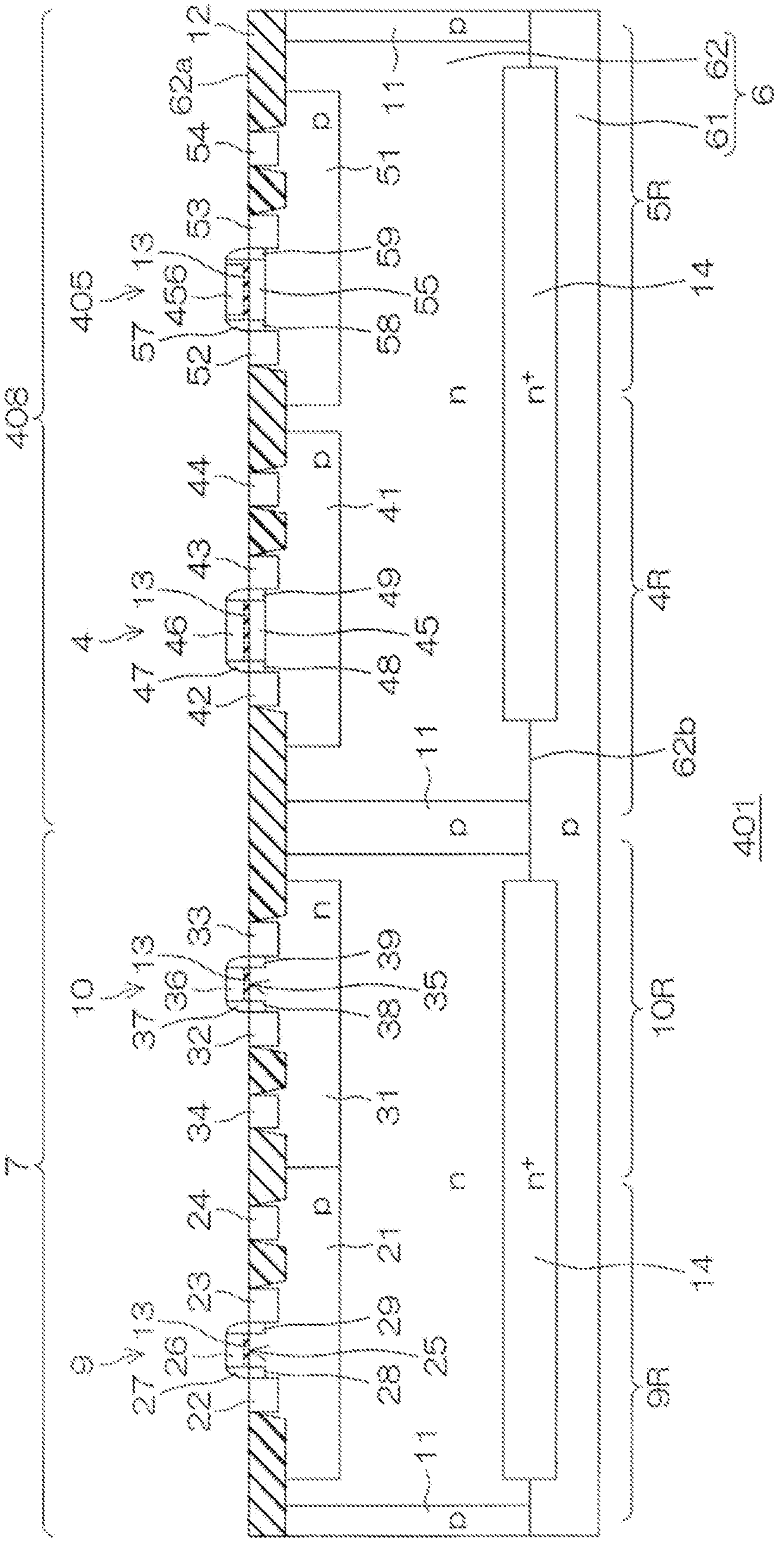
FIG. 10 is a schematic cross-sectional view of a semiconductor device according to a second embodiment of the present disclosure.
Figure 11:
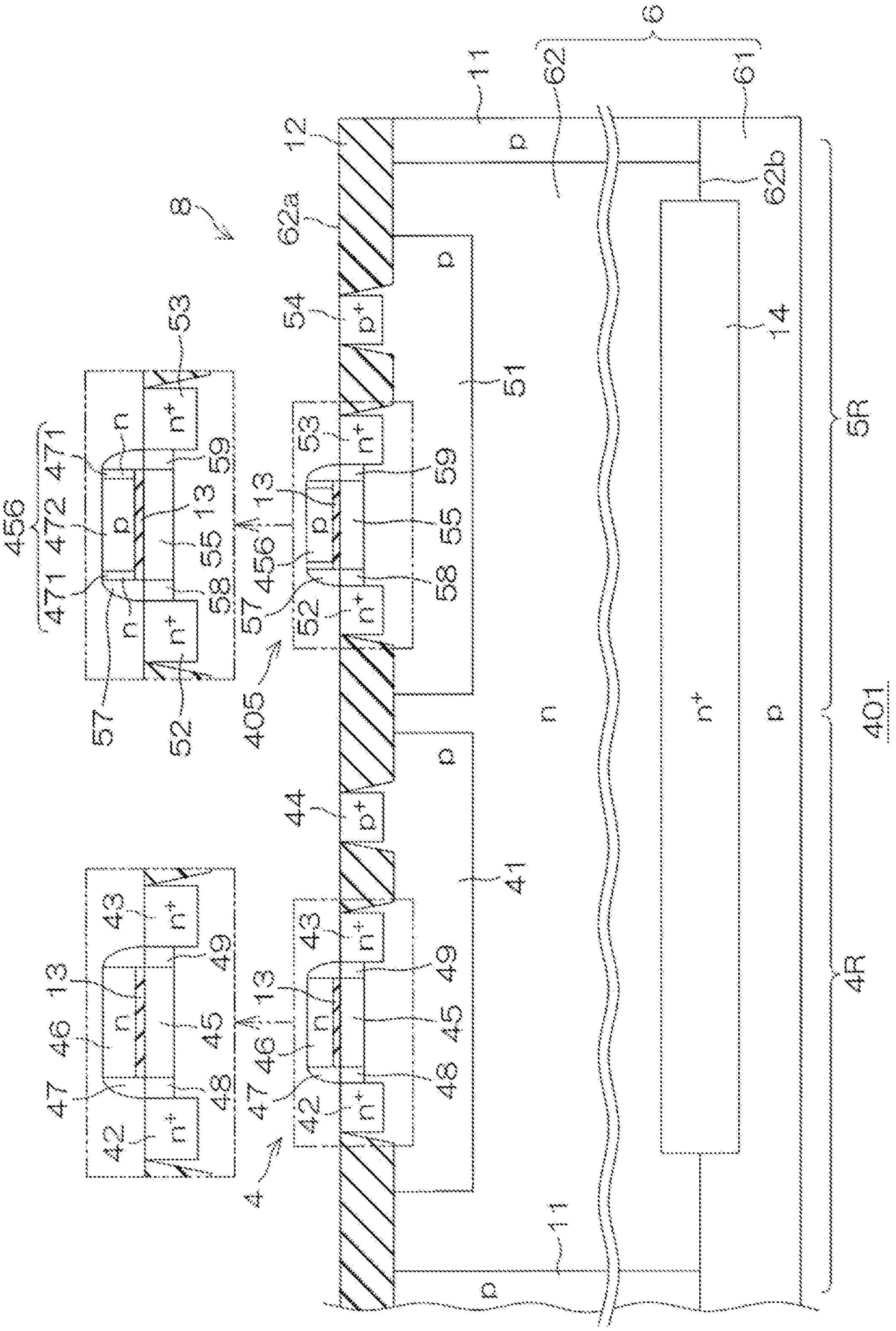
FIG. 11 is an enlarged cross-sectional view showing a Ref circuit region in FIG. 10.

FIG. 10 is a schematic cross-sectional view of a semiconductor device 401 according to a second embodiment of the present disclosure. FIG. 11 is an enlarged sectional view showing the Ref circuit region 8 of FIG. 10 in an enlarged manner.

In FIG. 10, parts corresponding to those shown in FIG. 2 are designated by the same reference numerals as in FIG. 2. In FIG. 11, parts corresponding to those shown in FIG. 4 are designated by the same reference numerals as in FIG. 4.

The circuit diagram of the semiconductor device 401 according to the second embodiment of the present disclosure is similar to the circuit diagram (FIG. 1) of the semiconductor device 1 according to the first embodiment of the present disclosure.

The semiconductor device 401 according to the second embodiment of the present disclosure includes a CMOS region and a Ref circuit region just like the semiconductor device 1 according to the first embodiment. The configuration of the CMOS region 7 of the semiconductor device 401 according to the second embodiment is the same as the configuration of the CMOS region 7 of the semiconductor device 1 according to the first embodiment.

The Ref circuit region 408 of the semiconductor device 401 according to the second embodiment includes a depletion type MOSFET 4 and an enhancement type MOSFET 405. The configuration of the depletion type MOSFET 4 of the semiconductor device 401 according to the second embodiment is the same as the configuration of the depletion type MOSFET 4 of the semiconductor device 1 according to the first embodiment.

The enhancement type MOSFET 405 of the semiconductor device 401 according to the second embodiment differs from the enhancement type MOSFET 5 of the semiconductor device 1 according to the first embodiment in that the main portion of the polysilicon gate 456 is made of p-type polysilicon.

Specifically, the polysilicon gate 456 includes n-type portions 471 on both sides of the polysilicon gate 456 and a p-type portion 472 between the n-type portions 471. The n-type portions 471 are made of n-type polysilicon. The p-type portion 472 is made of p-type polysilicon. The p-type impurity contained in the p-type portion 472 is boron (B) in this embodiment.

The p-type impurity concentration of the p-type portion 472 is lower than the p-type impurity concentration of the p-type portion 272 (see FIG. 7) of the second comparative example 201. The p-type impurity concentration of the p-type portion 472 may be $1\times10^{17}$ $cm^{-3}$ or less. The p-type impurity concentration of the p-type portion 272 of the second comparative example 201 is $1\times10^{19}$ $cm^{-3}$ or more.

In the semiconductor device 401 according to the second embodiment, as in the semiconductor device 1 according to the first embodiment, the n-type impurity concentration of the channel region 55 of the enhancement type MOSFET 405 is equal to the n-type impurity concentration of the channel region 45 of the depletion type MOSFET 4. Therefore, the slope of the Vg-Id characteristic of the depletion type MOSFET 4 and the slope of the Vg-Id characteristic of the enhancement type MOSFET 405 are substantially equal to each other. Therefore, the change in the reference voltage Vref due to the temperature can be suppressed as compared with the first comparative example 101.

Furthermore, in the semiconductor device 401 according to the second embodiment, the main portion (p-type portion 472) of the polysilicon gate 456 of the enhancement type MOSFET 5 contains a p-type impurity. However, the p-type impurity concentration thereof is lower than the p-type impurity concentration of the main portion (p-type portion 272) of the polysilicon gate 256 of the second comparative example 201. As a result, the diffusion of the p-type impurity in the polysilicon gate 456 of the enhancement type MOSFET 405 is suppressed as compared with the second comparative example. Therefore, variations in the manufacture and deterioration over time are less likely to occur as compared with the second comparative example 201.

The entire polysilicon gate 456 is made of p-type polysilicon. Even in this case, the concentration of the p-type impurity contained in the polysilicon gate 456 may be $1\times10^{17}$ $cm^{-3}$ or less.

FIGS. 12A to 12H are schematic views for describing a part of a process of manufacturing the semiconductor device 401 of FIG. 10 in the order of steps.

Figure 12A:
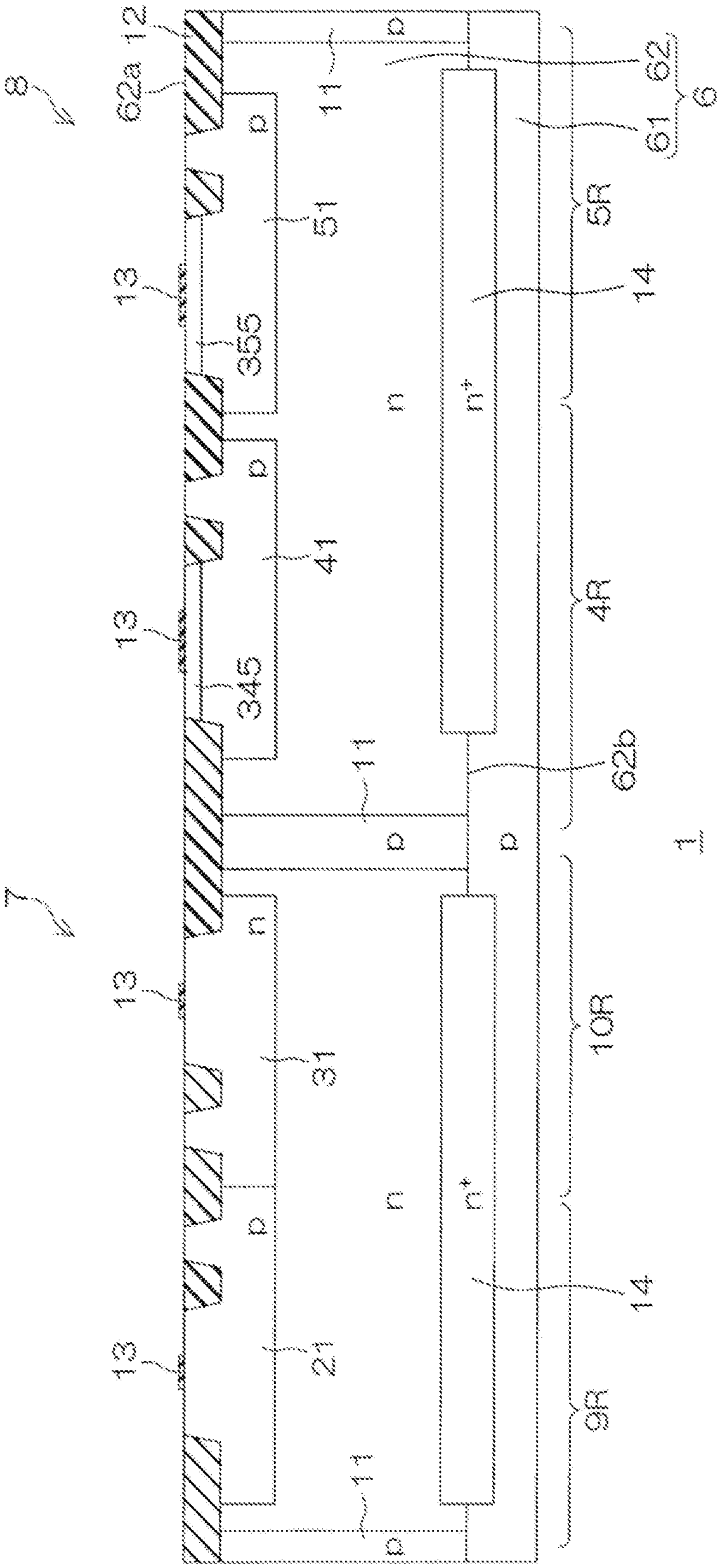
FIG. 12A is a view showing a part of a process of manufacturing the semiconductor device shown in FIG. 10.

First, as shown in FIG. 12A, a semiconductor device including a semiconductor substrate 6, an element isolation portion 11, an n-type buried layer 14, a p-type well 21, an n-type well 31, a p-type well 41, a p-type well 51, n-type impurity diffusion regions 345 and 355 for channel regions 45 and 55, a field insulating film 12, and a gate insulating film 13 is manufactured. The semiconductor substrate 6 includes a base substrate 61 and an n-type epitaxial layer 62 formed on the base substrate 61.

Figure 12B:
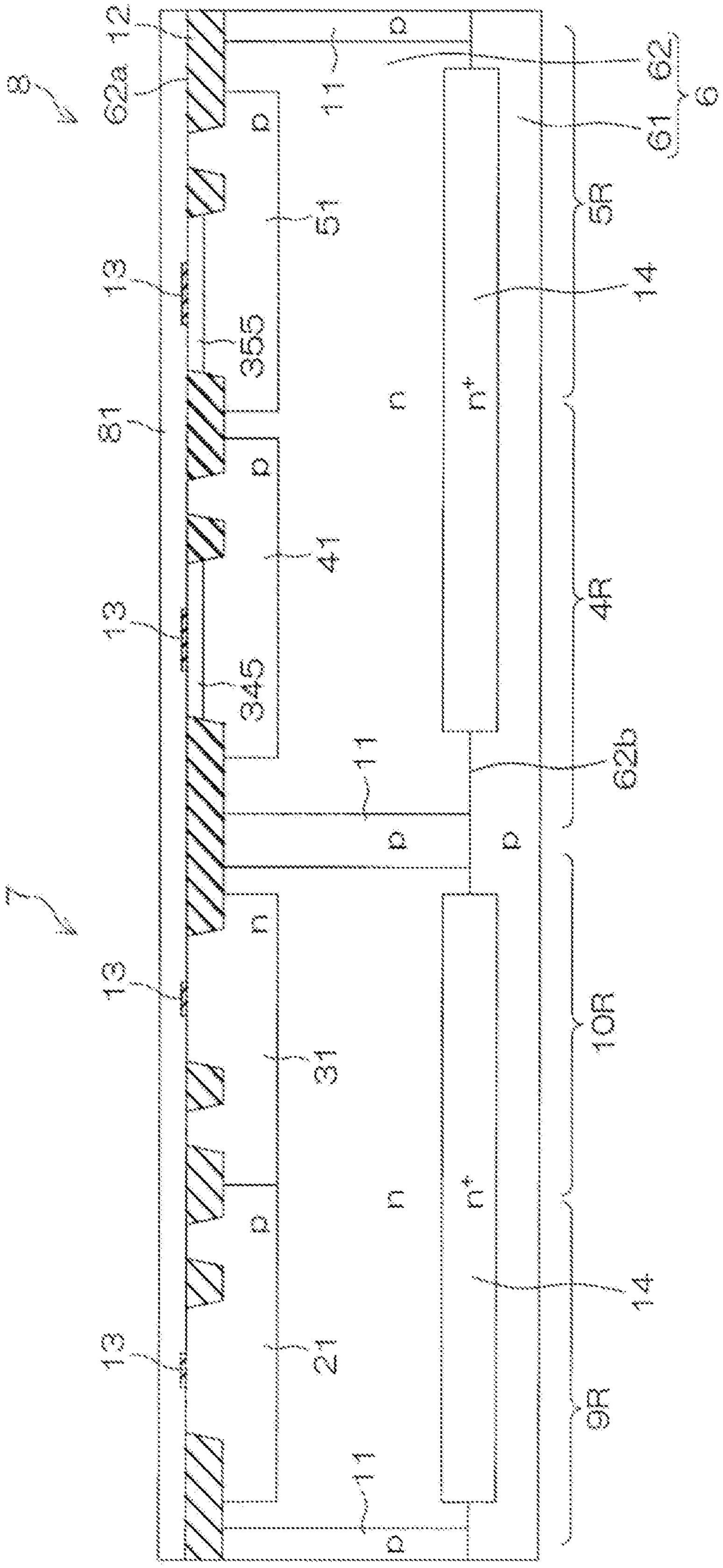
FIG. 12B is a view showing the next step of FIG. 12A.

Next, as shown in FIG. 12B, a non-doped polysilicon film 81 is formed over the entire surface of the semiconductor substrate 6 on the first main surface 62*a* side.

Figure 12C:
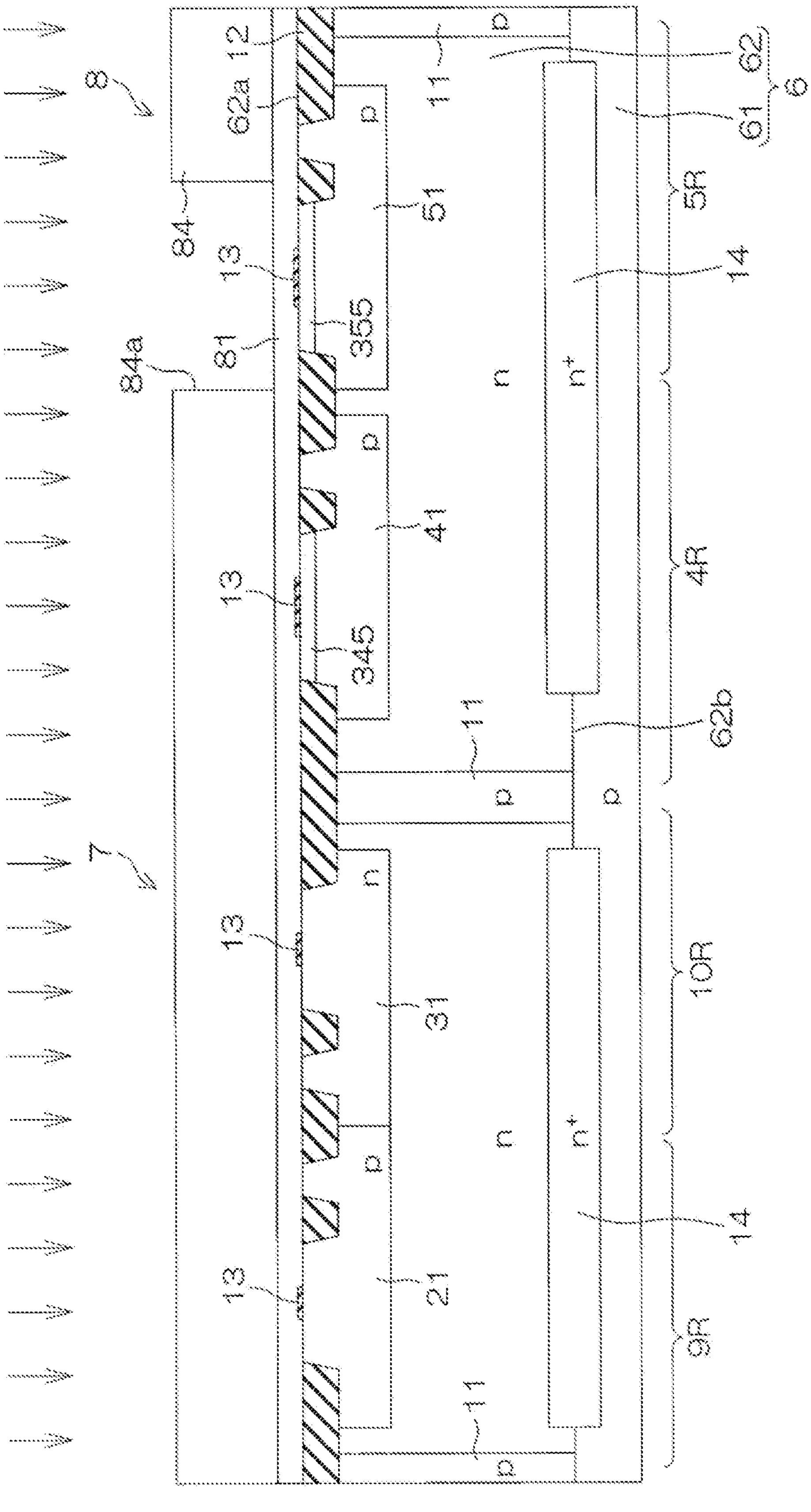
FIG. 12C is a view showing the next step of FIG. 12B.

Next, as shown in FIG. 12C, a resist film 84 having an opening 84*a* in a region including an expected formation region for a polysilicon gate 456 and facing a region including a portion of each of field insulating films 12 on both sides of the expected formation region is formed on the polysilicon film 81. Then, p-type impurity ions (e.g., $B^+$ ions) are implanted into the polysilicon film 81 through the resist film 84. Thereafter, the resist film 84 is removed. As a result, the portion of the polysilicon film 81 facing the opening 84*a* is made of p-type polysilicon.

Figure 12D:
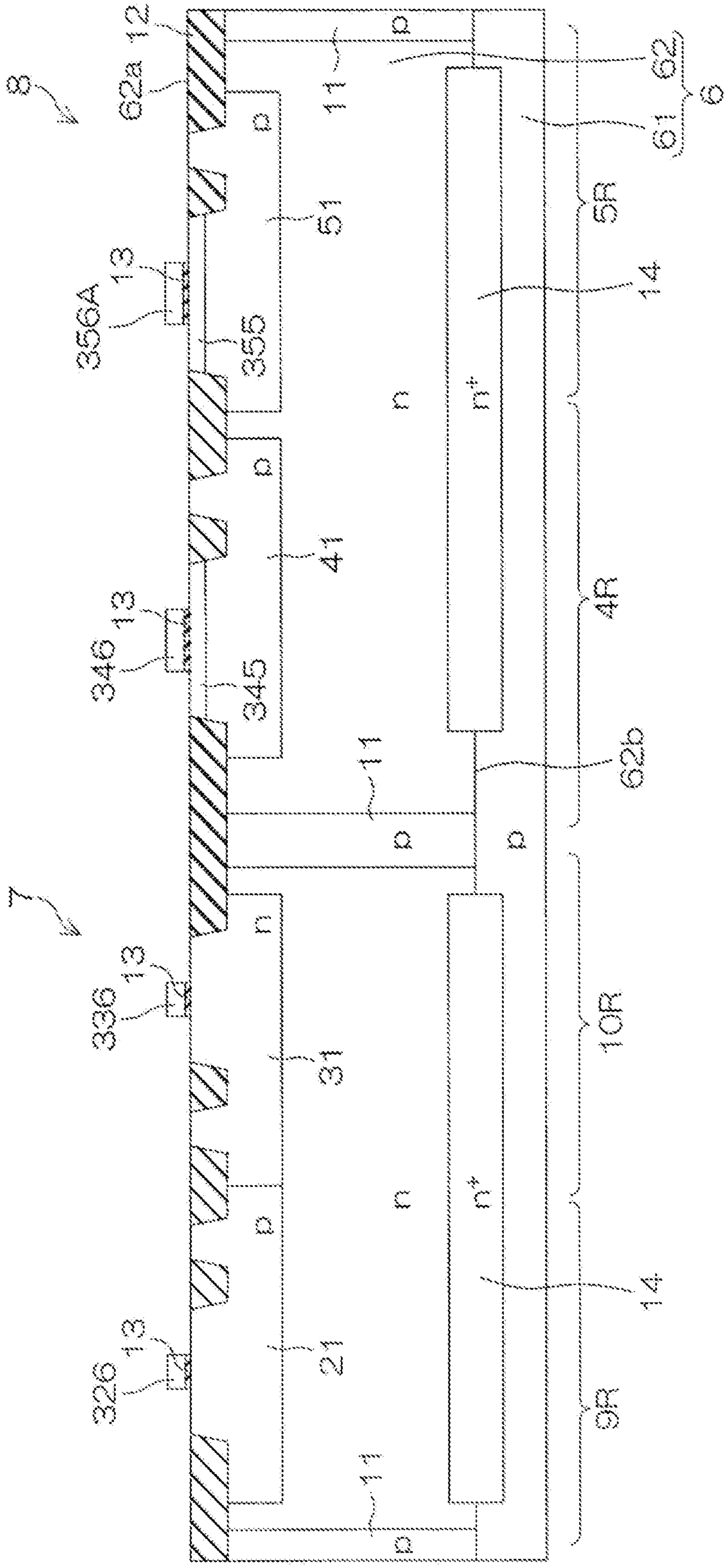
FIG. 12D is a view showing the next step of FIG. 12C.

Next, the polysilicon film 81 is patterned by photolithography. As a result, as shown in FIG. 12D, non-doped gates 326, 336 and 346 corresponding to the polysilicon gates 426, 436 and 446, and a p-type gate 356A corresponding to the polysilicon gate 456 are formed.

Figure 12E:
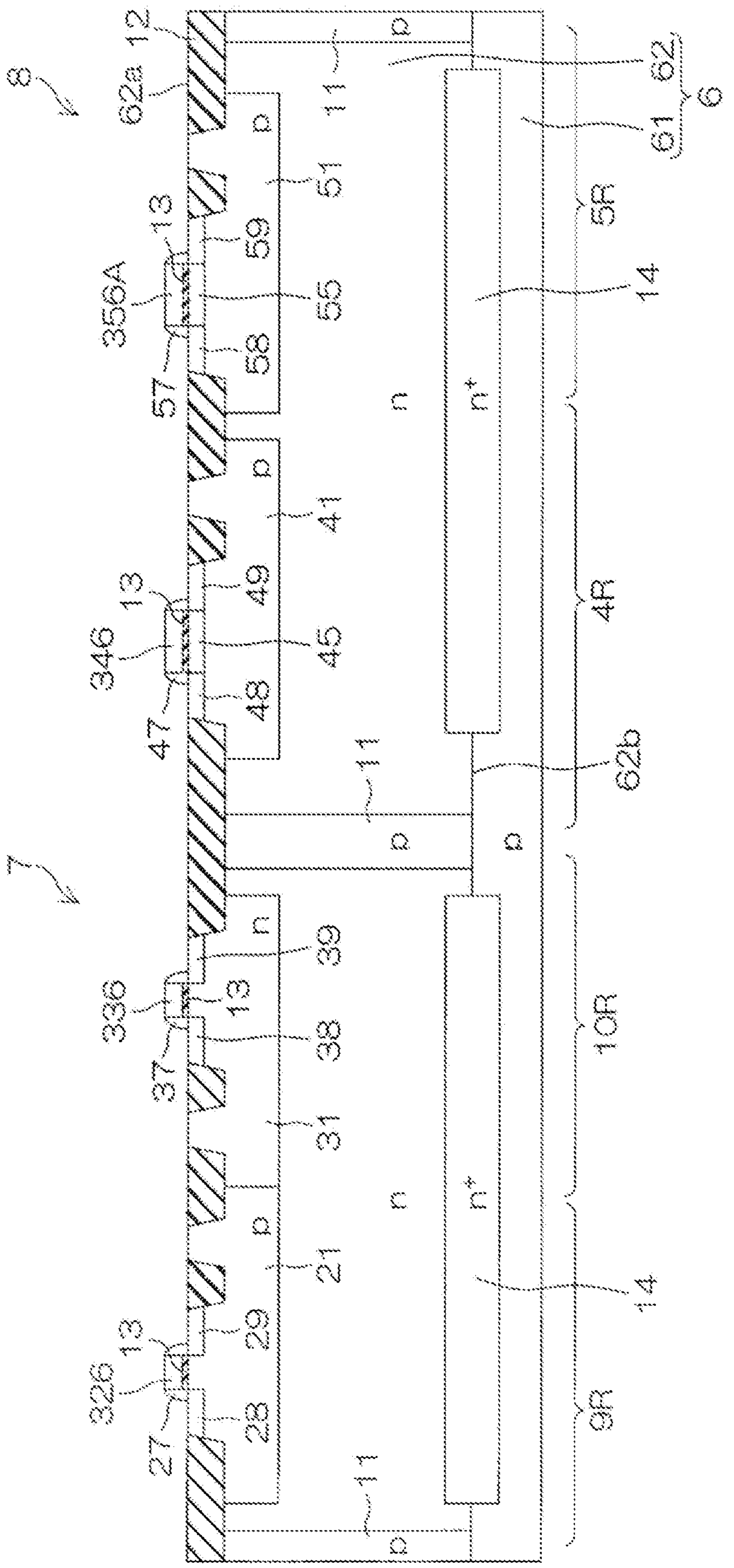
FIG. 12E is a view showing the next step of FIG. 12D.

Next, as shown in FIG. 12E, by implanting n-type impurity ions (e.g., $P^+$ ions) into the n-type epitaxial layer 62, the n-type low concentration layers 28, 29, 48 and 49 are formed in a self-aligned manner with respect to the non-doped gates 326 and 346, and n-type low concentration layers 58 and 59 are formed in a self-aligned manner with respect to the p-type gate 356A. Further, by implanting p-type impurity ions (e.g., $B^+$ ions) into the n-type epitaxial layer 62, p-type low concentration layers 38 and 39 are formed in a self-aligned manner with respect to the non-doped gate 336. When ions are implanted to form the low concentration layers 28, 29, 38, 39, 48, 49, 58 and 59, the p-type gate 356A is covered with a resist film.

Next, an insulating film such as a silicon oxide film or the like is formed over the entire surface of the semiconductor substrate 6 on the first main surface 62*a* side by a CVD method, and then the insulating film is etched back by dry etching. This etching-back is performed until the respective non-doped gates 326, 336 and 346 and the p-type gate 356A are exposed, thereby forming sidewalls 27, 37, 47 and 57 on both sides thereof.

Figure 12F:
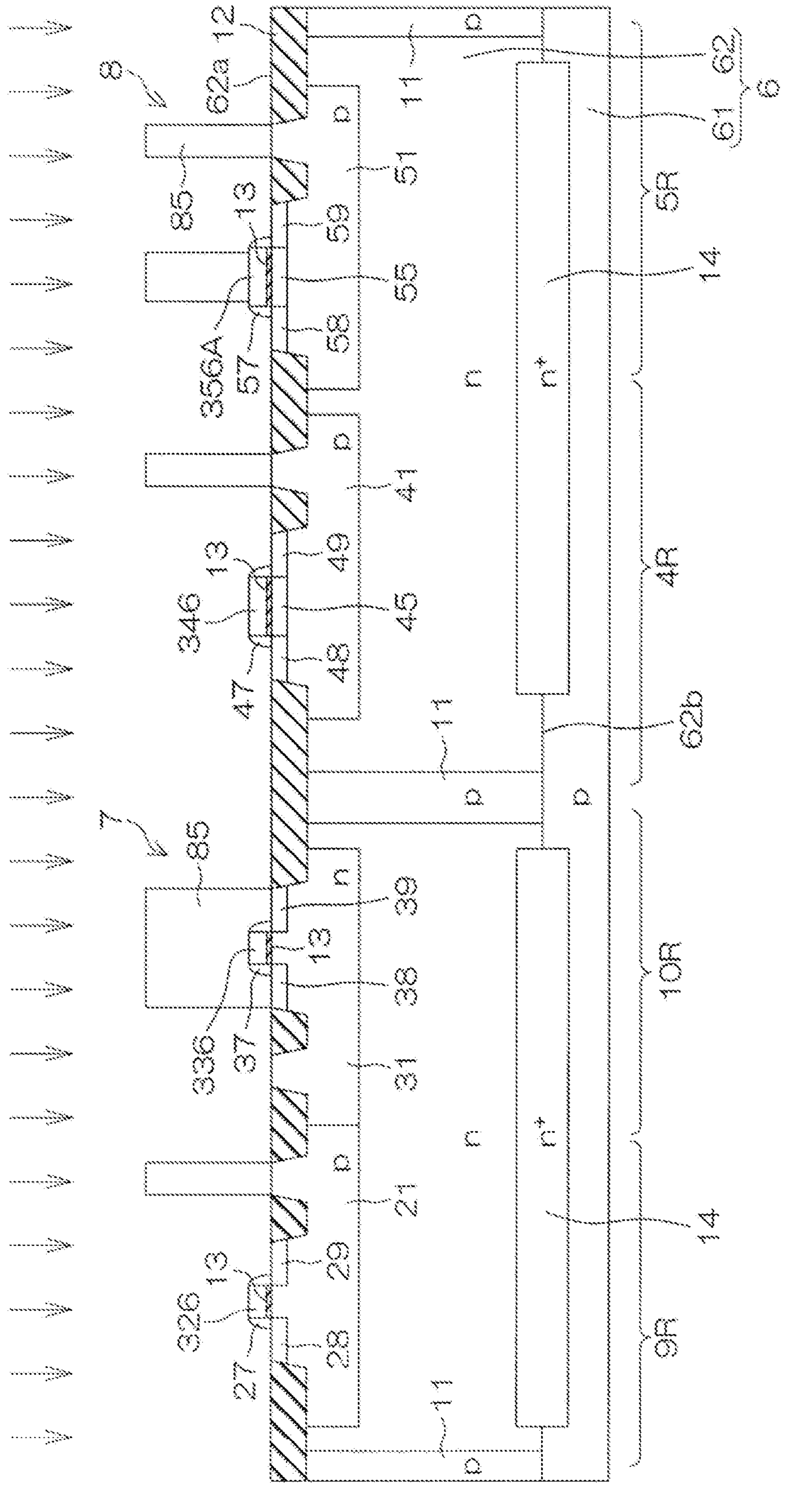
FIG. 12F is a view showing the next step of FIG. 12E.

Next, as shown in FIG. 12F, a resist film 85 is formed so as to cover expected formation regions for the p-type back gate regions 24, 44 and 54, an expected formation region for the p-type source region 32, the non-doped gate 336, the sidewalls 37, an expected formation region for the p-type drain region 33, and a region on the upper surface of the p-type gate 356A except for both sides thereof.

Then, n-type impurity ions (e.g., $P^+$ ions) are implanted into the non-doped gates 326 and 346, both sides of the p-type gate 356A, and the n-type epitaxial layer 62 through the resist film 85. Thereafter, the resist film 85 is removed.

Figure 12G:
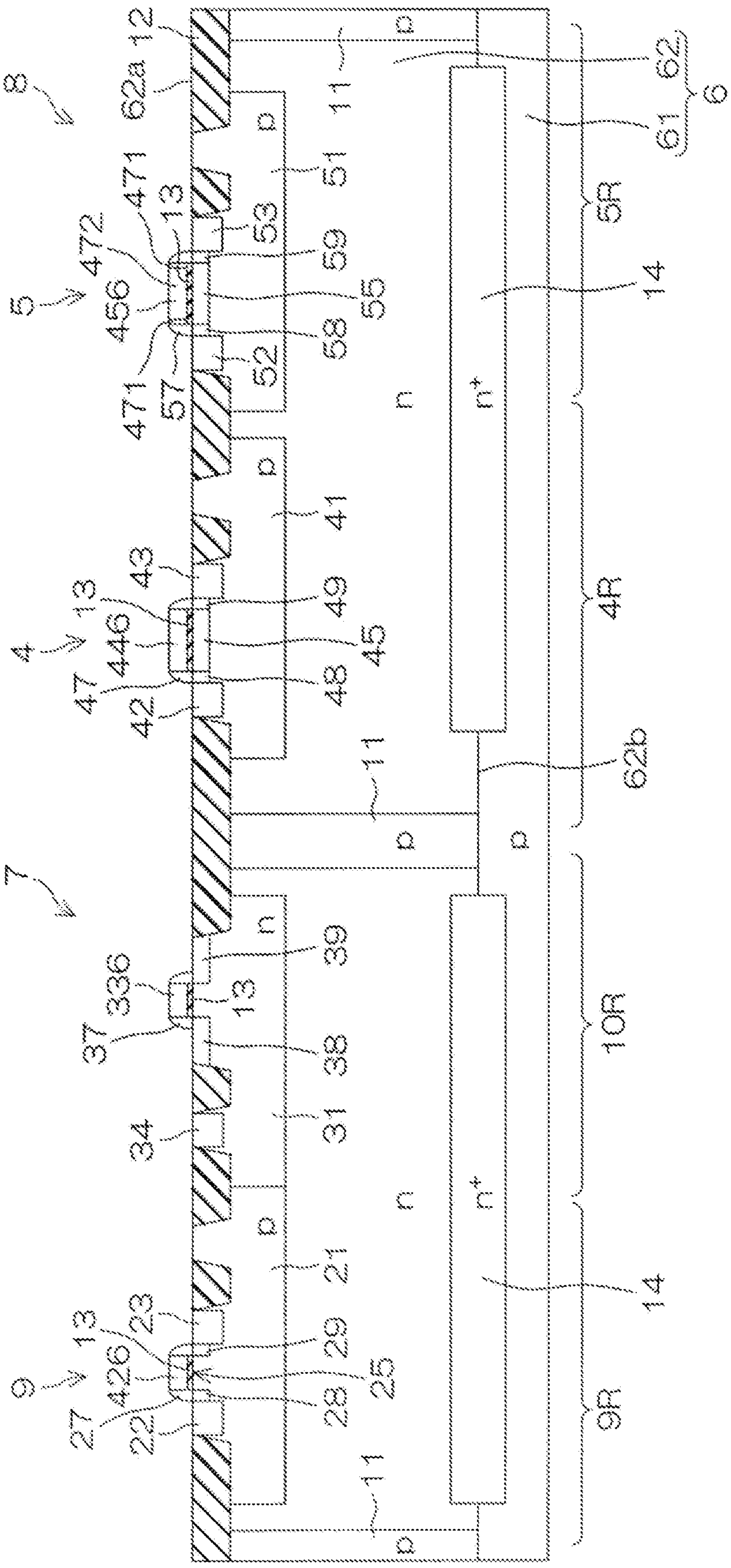
FIG. 12G is a view showing the next step of FIG. 12F.

As a result, as shown in FIG. 12G, n-type source regions 22, 42 and 52, n-type drain regions 23, 43 and 53, an n-type back gate region 34, n-type polysilicon gates 26 and 46, and a polysilicon gate 456 having an n-type portion 471 and a p-type portion 472 are formed.

Figure 12H:
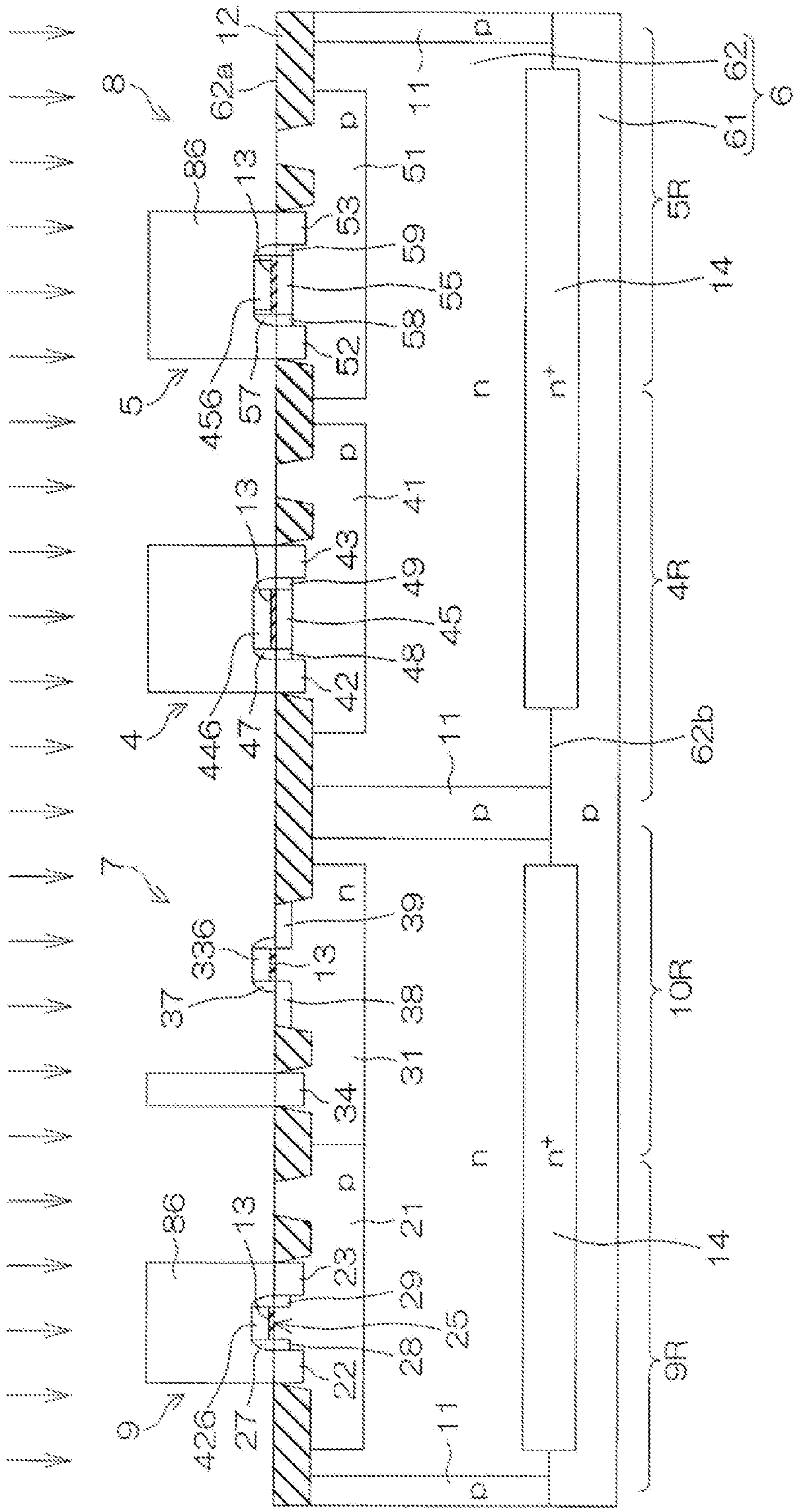
FIG. 12H is a view showing the next step of FIG. 12G.

Next, as shown in FIG. 12H, a resist film 86 is formed so as to cover each of the n-type source regions 22, 42 and 52, each of the n-type drain regions 23, 43 and 53, the n-type back gate region 34, the n-type polysilicon gate 26 and 46 and its sidewalls 27 and 47, and the polysilicon gate 456 and its sidewall 57. Then, p-type impurity ions (e.g., $B^+$ ions) are implanted into the non-doped gate 336 and the n-type epitaxial layer 62 through the resist film 86. Thereafter, the resist film 86 is removed.

Thus, a p-type polysilicon gate 36, a p-type source region 32, a p-type drain region 33, and p-type back gate regions 24, 44 and 54 are formed. As a result, a semiconductor device 401 as shown in FIG. 10 is obtained.

Figure 13:
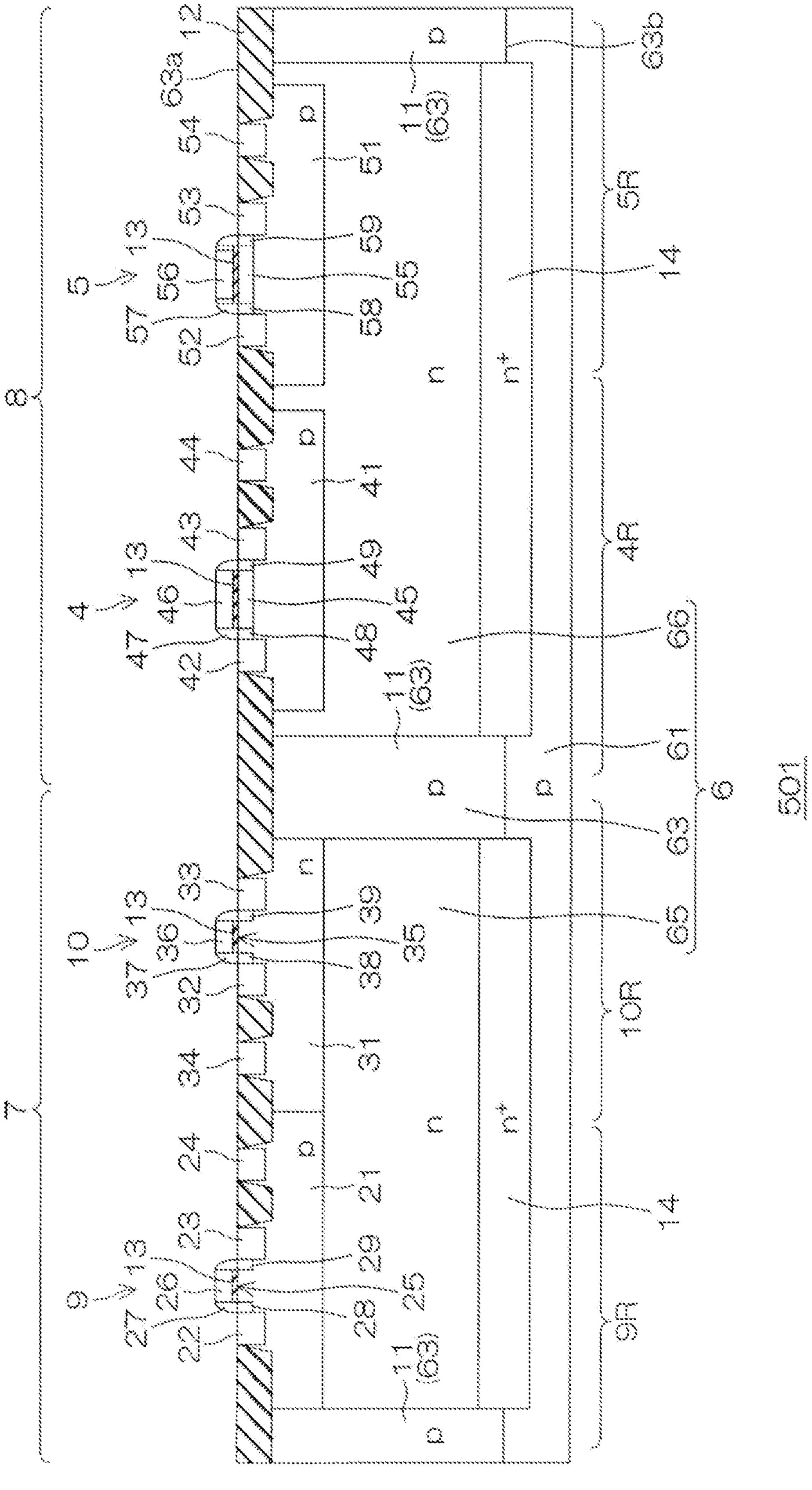
FIG. 13 is a cross-sectional view showing a semiconductor device according to a first modification of the first embodiment, which corresponds to FIG. 2.

FIG. 13 is a cross-sectional view showing a semiconductor device 501 according to a first modification of the first embodiment, which corresponds to FIG. 2. In FIG. 13, parts corresponding to those shown in FIG. 2 are designated by the same reference numerals as in FIG. 2.

The semiconductor device 501 according to the first modification (hereinafter referred to as "first modification 501") differs from the semiconductor device 1 according to the first embodiment in terms of the configuration and internal structure of the semiconductor substrate 6.

In the first modification 501, the semiconductor substrate 6 includes a base substrate 61, a p-type epitaxial layer 63, an n-type region 65, and an n-type region 66. The p-type epitaxial layer 63 has a first main surface 63*a* on the opposite side to the base substrate 61, and a second main surface 63*b* on the opposite side to the first main surface 63*a*.

The p-type epitaxial layer 63 is formed on the semiconductor substrate 6. In the CMOS region 7, the n-type buried layer 14 is formed so as to straddle the boundary between the base substrate 61 and the p-type epitaxial layer 63. In the Ref circuit region 8, the n-type buried layer 14 is formed so as to straddle the boundary between the base substrate 61 and the p-type epitaxial layer 63.

In the CMOS region 7, the n-type region 65 is formed in the surface layer region of the p-type epitaxial layer 63 and above the n-type buried layer 14. In the Ref circuit region 8, the n-type region 66 is formed in the surface layer region of the p-type epitaxial layer 63 and above the n-type buried layer 14. The element isolation portion 11 is formed of a p-type epitaxial layer 63.

A p-type well 21 and an n-type well 31 are formed in the surface layer region of the n-type region 65, and a p-type well 41 and a p-type well 51 are formed in the surface layer region of the n-type region 66.

The configuration and internal structure of the semiconductor substrate 6 according to the first modification 501 may also be applied to the semiconductor device 401 according to the second embodiment.

Figure 14:
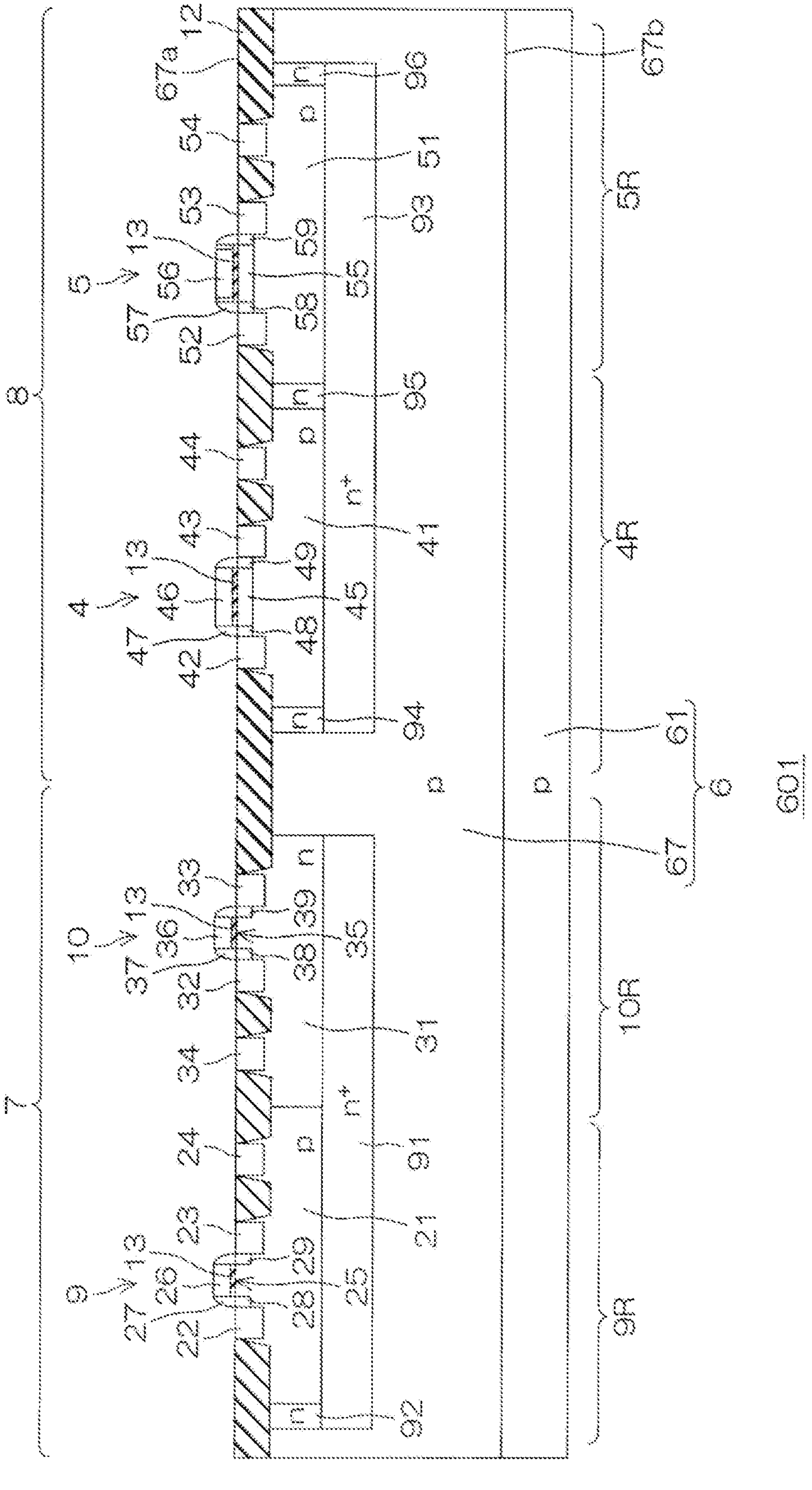
FIG. 14 is a cross-sectional view showing a semiconductor device according to a second modification of the first embodiment, which corresponds to FIG. 2.

FIG. 14 is a cross-sectional view showing a semiconductor device 601 according to a second modification of the first embodiment, which corresponds to FIG. 2. In FIG. 14, parts corresponding to those shown in FIG. 2 are designated by the same reference numerals as in FIG. 2.

The semiconductor device 601 according to the second modification (hereinafter referred to as "second modification 601") differs from the semiconductor device 1 according to the first embodiment in terms of the configuration and internal structure of the semiconductor substrate 6.

In the first modification 601, the semiconductor substrate 6 includes a base substrate 61, and a p-type epitaxial layer 67 formed on the base substrate 61. The p-type epitaxial layer 67 has a first main surface 67*a* on the opposite side to the base substrate 61, and a second main surface 67*b* on the opposite side to the first main surface 67*a*.

In the CMOS region 7, a deep n-type well (DNW) 91 is formed in the intermediate thickness portion of the p-type epitaxial layer 67. In CMOS region 7, a p-type well 21 and an n-type well 31 are formed in a region between the deep n-type well 91 and the first main surface 67*a* of the p-type epitaxial layer 67.

Further, an n-type region 92 that covers the side surface of the p-type well 21 opposite to the n-type well 31 is formed in a region between the deep n-type well 91 and the first main surface 67*a* of the p-type epitaxial layer 67.

In the Ref circuit region 8, a deep n-type well (DNW) 93 is formed in the intermediate thickness portion of the p-type epitaxial layer 67. In the Ref circuit region 8, a p-type well 41 and a p-type well 51 are formed in a region between the deep n-type well 93 and the first main surface 67*a* of the p-type epitaxial layer 67.

Further, an n-type region 94 that covers the side surface of the p-type well 41 opposite to the p-type well 51, an n-type region 95 arranged between the p-type well 41 and the p-type well 51, and an n-type region 96 that covers the side surface of the p-type well 51 on the side opposite to the p-type well 41 are formed in a region between the deep n-type well 93 and the first main surface 67*a* of the p-type epitaxial layer 67.

The configuration and internal structure of the semiconductor substrate 6 according to the second modification 601 may also be applied to the semiconductor device 401 according to the second embodiment.

Figure 15:
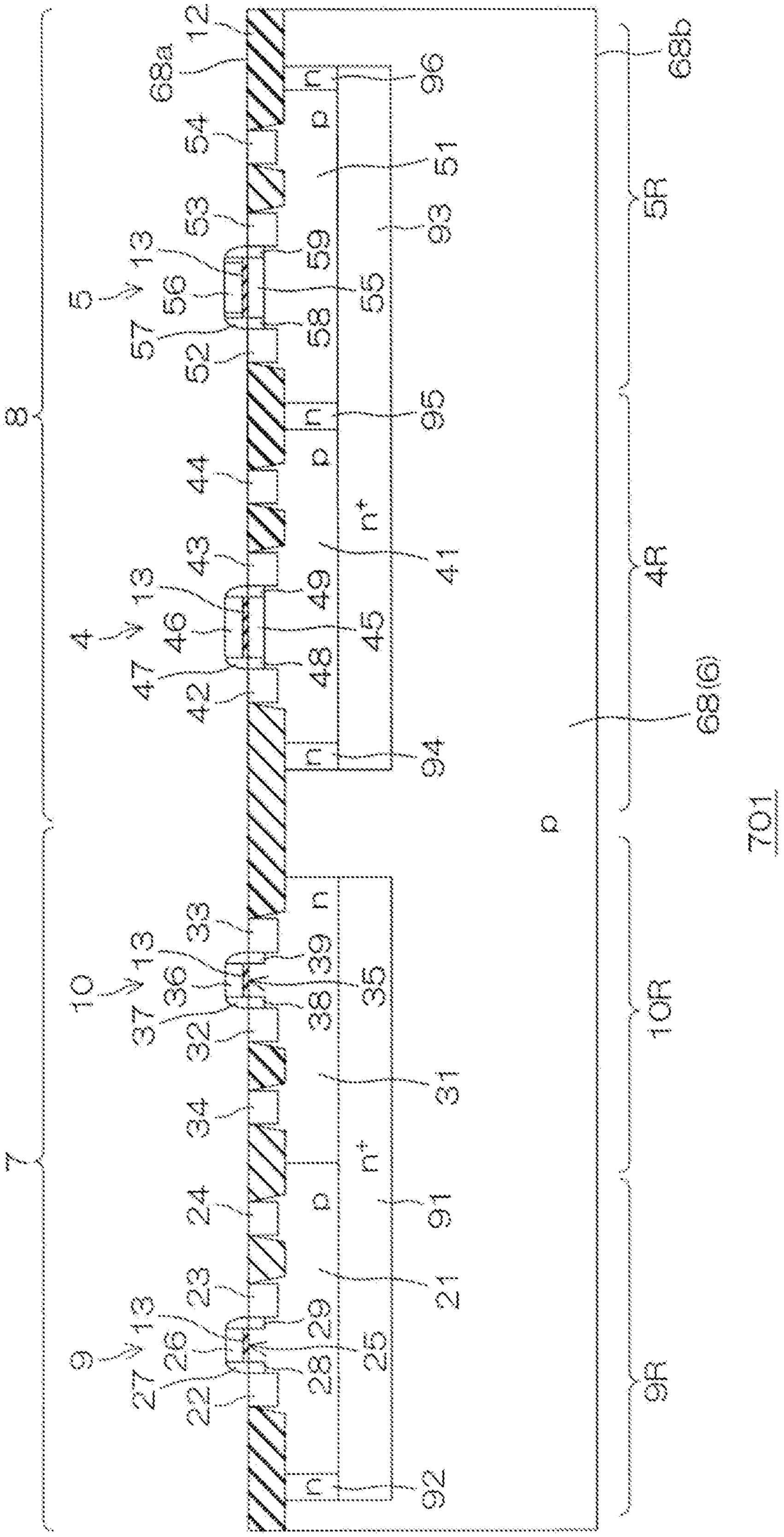
FIG. 15 is a cross-sectional view showing a semiconductor device according to a third modification of the first embodiment, which corresponds to FIG. 2.

FIG. 15 is a cross-sectional view showing a semiconductor device 701 according to a third modification of the first embodiment, which corresponds to FIG. 2. In FIG. 15, parts corresponding to those shown in FIG. 2 are designated by the same reference numerals as in FIG. 2.

The semiconductor device 701 according to the third modification (hereinafter referred to as "third modification 701") differs from the semiconductor device 1 according to the first embodiment in terms of the configuration and internal structure of the semiconductor substrate 6.

In the second modification 601, the semiconductor substrate 6 is composed of only a p-type semiconductor substrate 68. The p-type semiconductor substrate 68 has a first main surface 68*a* on which p-type wells 21, 41 and 51 and an n-type well 31 are formed, and a second main surface 68*b* on the opposite side to the first main surface 68*a*.

In the CMOS region 7, a deep n-type well (DNW) 91 is formed in the intermediate thickness portion of the p-type semiconductor substrate 68 (semiconductor substrate 6). In the CMOS region 7, a p-type well 21 and an n-type well 31 are formed in a region between the deep n-type well 91 and the first main surface 68*a* of the p-type semiconductor substrate 68.

Further, an n-type region 92 that covers the side surface of the p-type well 21 opposite to the n-type well 31 is formed in a region between the deep n-type well 91 and the first main surface 68*a* of the p-type semiconductor substrate 68.

In the Ref circuit region 8, a deep n-type well (DNW) 93 is formed in the intermediate thickness portion of the p-type semiconductor substrate 68. In the Ref circuit region 8, a p-type well 41 and a p-type well 51 are formed in a region between the deep n-type well 93 and the first main surface 68*a* of the p-type semiconductor substrate 68.

Further, an n-type region 94 that covers the side surface of the p-type well 41 opposite to the p-type well 51, an n-type region 95 arranged between the p-type well 41 and the p-type well 51, and an n-type region 96 that covers the side surface of the p-type well 51 on the side opposite to the p-type well 41 are formed in a region between the deep n-type well 93 and the first main surface 68*a* of the p-type semiconductor substrate 68.

The configuration and internal structure of the semiconductor substrate 6 according to the third modification 701 may also be applied to the semiconductor device 401 according to the second embodiment.

Although the first embodiment, the second embodiment, the first modification, the second modification, and the third modification have been described above, the present disclosure may be implemented in other forms as well.

In the first embodiment described above, the polysilicon gate 56 of the enhancement type MOSFET 5 includes n-type portions 71 on both sides and a non-doped portion 72 between the n-type portions 71. The reason why the n-type portions 71 on both sides are formed will be described.

Figure 16:
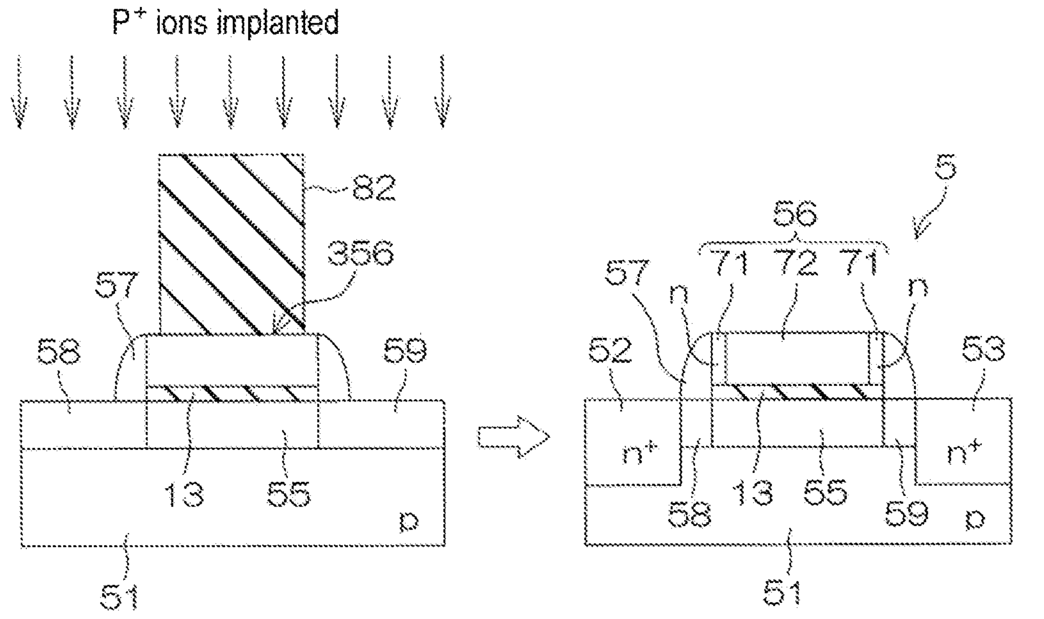
FIG. 16 is a schematic view for explaining the reason why n-type portions are formed on both sides of a polysilicon gate of an enhancement type MOSFET.

When forming the n-type source region 52 and the n-type drain region 53 of the enhancement type MOSFET 5, as shown on the left side in FIG. 16, a resist film 82 (see FIG. 9F) is formed on the non-doped gate 356. Then, n-type impurity ions (e.g., $P^+$ ions) are implanted into the p-type well 51 through the resist film 82.

At this time, if one side or both sides of the resist film 82 is formed to protrude outward from the sidewalls 57, one or both of the n-type source region 22 and the n-type drain region 23 is not formed in a self-aligned manner with respect to the sidewalls 27. If this happens, the characteristics of the enhancement type MOSFET 5 will be changed.

Therefore, in order to prevent both sides of the resist film 82 from protruding beyond the sidewalls 57, as shown on the left side in FIG. 16, the resist film 82 is formed such that both sides of the resist film 82 are recessed inward from the corresponding sides of the upper surface of the polysilicon gate 56. By doing so, as shown on the right side in FIG. 16, the n-type source region 22 and the n-type drain region 23 are formed in a self-aligned manner with respect to the sidewalls 27. Therefore, variations in the characteristics of the enhancement type MOSFET 5 are difficult to occur. For this reason, the n-type portions 71 are formed on both sides of the polysilicon gate 56.

In the semiconductor device 1 according to the first embodiment, the n-type portions 71 may not be formed on both sides of the polysilicon gate 56. That is, the entire polysilicon gate 56 may be made of non-doped polysilicon. In order to obtain such a configuration, the enhancement type MOSFET 5 may have the following structure.

Figure 17:
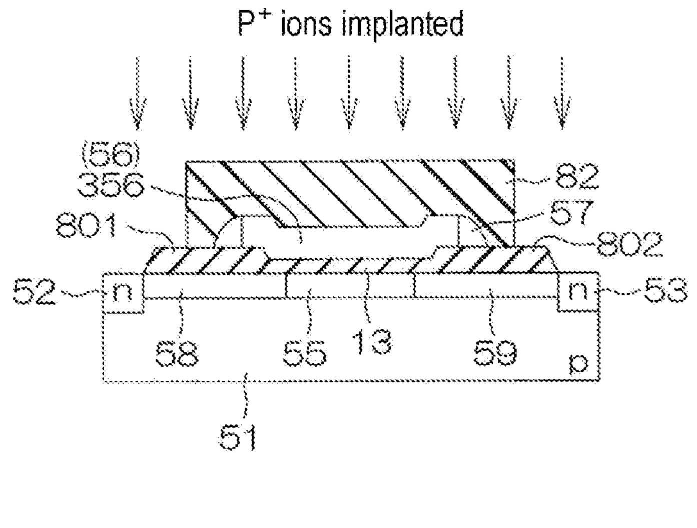
FIG. 17 is a partially enlarged cross-sectional view showing a configuration in which gate insulating films thicker than the gate insulating film are formed on both sides of the gate insulating film of the enhancement type MOSFET.

For example, as shown in FIG. 17, gate insulating films 801 and 802 thicker than the gate insulating film 13 are formed on both sides of the gate insulating film 13. One end of the gate insulating film 801 is connected to the side edge of the gate insulating film 13 on the n-type source region 52 side, and the other end of the gate insulating film 801 extends beyond the sidewall 57 on the n-type source region 52 side by a predetermined length. Similarly, one end of the gate insulating film 802 is connected to the side edge of the gate insulating film 13 on the n-type drain region 53 side, and the other end of the gate insulating film 802 extends beyond the side wall 57 on the n-type drain region 53 side by a predetermined length. The non-doped gate 356 is formed so that both sides of the non-doped gate 356 ride on the corresponding gate insulating films 801 and 802, respectively.

In order to form the n-type source region 52 and the n-type drain region 53 of the enhancement type MOSFET 5, the resist film 82 is formed so that both sides of the resist film 82 are located between the outer edges of the sidewalls 57 on the corresponding sides and the outer edges of the gate insulating films 801 and 802 on the corresponding sides. N-type impurity ions (e.g., $P^+$ ions) are implanted into the p-type well 51 through the resist film 82.

In this case, since the entire non-doped gate 356 is covered with the resist film 82, n-type portions 71 are not formed on both sides of the non-doped gate 356. Further, in this case, since the n-type source region 52 and the n-type drain region 53 are formed in a self-aligned manner with respect to the gate insulating films 801 and 802, variations in the characteristics of the enhancement type MOSFET 5 are less likely to occur.

Figure 18:
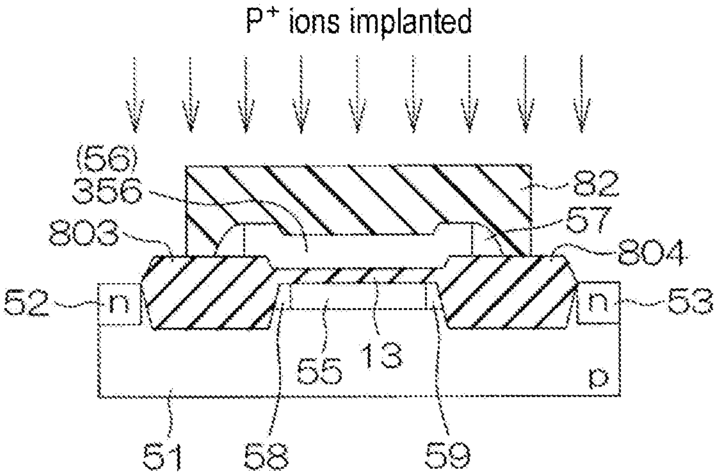
FIG. 18 is a partially enlarged cross-sectional view showing a configuration in which LOCOS oxide films are formed on both sides of the gate insulating film of the enhancement type MOSFET.

As shown in FIG. 18, LOCOS (local oxidation of silicon) oxide films 803 and 804 may be formed in place of the gate insulating films 801 and 802 shown in FIG. 17. Furthermore, as shown in FIG. 19, STI (shallow trench isolation) oxide films 805 and 806 may be formed in place of the gate insulating films 801 and 802 shown in FIG. 18.

Figure 19:
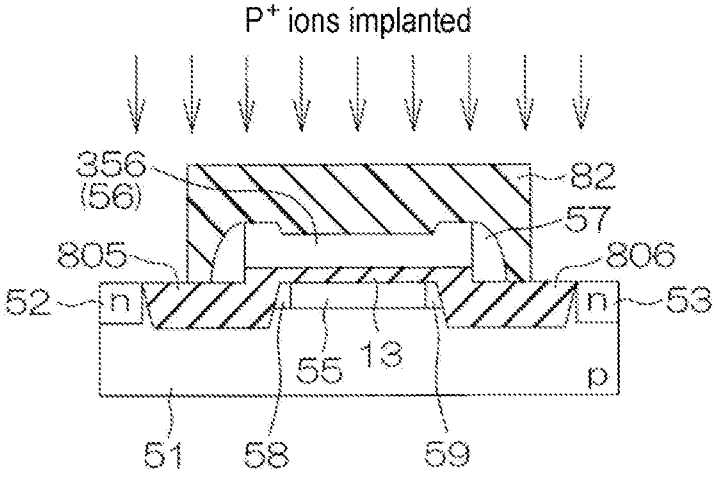
FIG. 19 is a partially enlarged cross-sectional view showing a configuration in which STI oxide films are formed on both sides of the gate insulating film of the enhancement type MOSFET.

The configurations shown in FIGS. 18 and 19 may also be applied to the semiconductor device 401 according to the second embodiment of the present disclosure.

Although the embodiments of the present disclosure have been described in detail above, these are nothing more than specific examples used to clarify the technical content of the present disclosure. The present disclosure should not be construed as being limited to these specific examples. Rather, the scope of the present disclosure is limited only by the claims appended hereto.

The features described below as supplementary notes can be extracted from the description of this specification and the drawings.

Supplementary Note 1-1

An enhancement type MOSFET (5), comprising:

a semiconductor layer (62) having a first main surface on one side and a second main surface on another side, and having a p-type region (51) in a surface layer region on the side of the first main surface;

an n-type source region (52) and an n-type drain region (53) formed at an interval from each other in a surface layer region of the p-type region (51);

a channel region (55) formed between the n-type source region (52) and the n-type drain region (53);

a gate insulating film (13) disposed on the channel region; and a polysilicon gate (56) formed on the gate insulating film, wherein at least a main portion (72) of the polysilicon gate (56) is made of non-doped polysilicon.

Supplementary Note 1-2

An enhancement type MOSFET (405), comprising:

a semiconductor layer (62) having a first main surface on one side and a second main surface on another side, and having a p-type region (51) in a surface layer region on the side of the first main surface;

an n-type source region (52) and an n-type drain region (53) formed at an interval from each other in a surface layer region of the p-type region (51);

a channel region (55) formed between the n-type source region (52) and the n-type drain region (53);

a gate insulating film (13) disposed on the channel region; and a polysilicon gate (456) formed on the gate insulating film, wherein the polysilicon gate (456) includes a p-type portion (472) formed in at least a main portion of the polysilicon gate (456) and made of p-type polysilicon, and a p-type impurity concentration of the p-type portion (472) is $1\times10^{17}$ $cm^{-3}$ or less.

Supplementary Note 1-3

The enhancement type MOSFET (5 or 405) of [Supplementary Note 1-1] or [Supplementary Note 1-2], wherein the channel region (55) contains an n-type impurity.

Supplementary Note 1-4

The enhancement type MOSFET (5 or 405) of any one of [Supplementary Note 1-1] to [Supplementary Note 1-3], wherein the polysilicon gate (56 or 456) includes n-type portions (71 or 471) formed on both sides of the polysilicon gate and made of n-type polysilicon.

Supplementary Note 1-5

The enhancement type MOSFET (5 or 405) of any one of [Supplementary Note 1-1] to [Supplementary Note 1-4], wherein, in the surface layer region of the p-type region (51), two n-type low concentration regions (58 and 59) having a lower n-type impurity concentration than both of the n-type source region (52) and the n-type drain region (53) are disposed between the n-type source region (52) and the polysilicon gate (56 or 456) and between the n-type drain region (53) and the polysilicon gate (56 or 456), and the channel region (55) is formed in a region between the two n-type low concentration regions (58 and 59).

Supplementary Note 1-6

The enhancement type MOSFET (5 or 405) of any one of [Supplementary Note 1-1] to [Supplementary Note 1-5], further comprising:

sidewalls (57) made of an insulating material and configured to cover both sides of the polysilicon gate (56 or 456).

Supplementary Note 1-7

The enhancement type MOSFET (5 or 405) of [Supplementary Note 1-6], wherein the two n-type low concentration regions (58 and 59) are formed in a region directly below the sidewalls (57).

Supplementary Note 1-8

A semiconductor device (1), comprising:

a semiconductor layer (62) having a first main surface on one side and a second main surface on another side, and having a first p-type region (41) and a second p-type region (42) formed at an interval from each other in a surface layer region on the side of the first main surface;

a depletion type MOSFET (4); and an enhancement type MOSFET (5), wherein the depletion type MOSFET (4) includes a first n-type source region (42) and a first n-type drain region (43) formed at an interval from each other in a surface layer region of the first p-type region (41), a first channel region (45) formed between the first n-type source region (42) and the first n-type drain region (43), a first gate insulating film (13) disposed on the first channel region, and a first polysilicon gate (46) formed on the first gate insulating film and containing a p-type impurity, wherein the enhancement type MOSFET (5) includes a second n-type source region (52) and a second n-type drain region (53) formed at an interval from each other in a surface layer region of the second p-type region (51), a second channel region (55) formed between the second n-type source region (52) and the second n-type drain region (53) and having the same impurity concentration as an impurity concentration of the first channel region (45), a second gate insulating film disposed on the second channel region, and a second polysilicon gate (56) formed on the second gate insulating film, and wherein at least a main portion (72) of the second polysilicon gate (56) is made of non-doped polysilicon.

Supplementary Note 1-9

A semiconductor device (401), comprising:

a semiconductor layer (62) having a first main surface on one side and a second main surface on another side, and having a first p-type region (41) and a second p-type region (42) formed at an interval from each other in a surface layer region on the side of the first main surface;

a depletion type MOSFET (4); and an enhancement type MOSFET (405), wherein the depletion type MOSFET (4) includes a first n-type source region (42) and a first n-type drain region (43) formed at an interval from each other in a surface layer region of the first p-type region (41), a first channel region (45) formed between the first n-type source region (42) and the first n-type drain region (43), a first gate insulating film (13) disposed on the first channel region, and a first polysilicon gate (46) formed on the first gate insulating film and containing a p-type impurity, wherein the enhancement type MOSFET (405) includes a second n-type source region (52) and a second n-type drain region (53) formed at an interval from each other in a surface layer region of the second p-type region (42), a second channel region (55) formed between the second n-type source region (52) and the second n-type drain region (53) and having the same impurity concentration as an impurity concentration of the first channel region (45), a second gate insulating film disposed on the second channel region, and a second polysilicon gate (456) formed on the second gate insulating film, wherein the polysilicon gate (456) includes a p-type portion (472) formed in at least a main portion of the polysilicon gate and made of p-type polysilicon, and wherein a p-type impurity concentration of the p-type portion (472) is $1\times10^{17}$ $cm^{-3}$ or less.

Supplementary Note 1-10

The semiconductor device of [Supplementary Note 1-8] or [Supplementary Note 1-9], wherein the polysilicon gate (56 or 456) includes n-type portions (71 or 471) formed on both sides of the polysilicon gate and made of n-type polysilicon.

Supplementary Note 1-11

The semiconductor device of any one of [Supplementary Note 1-8] to [Supplementary Note 1-10], wherein in the surface layer region of the second p-type region (51), two second n-type low concentration regions (58 and 59) having a lower n-type impurity concentration than both of the second n-type source region (52) and the second n-type drain region (53) are disposed between the second n-type source region (52) and the second polysilicon gate (56 or 456) and between the second n-type drain region (53) and the second polysilicon gate (56 or 456), and the second channel region (55) is formed in a region between the two second n-type low concentration regions (58 and 59).

Supplementary Note 1-12

The semiconductor device of [Supplementary Note 1-11], further comprising:

second sidewalls (57) made of an insulating material and configured to cover both sides of the second polysilicon gate (56 or 456).

Supplementary Note 1-13

The semiconductor device of [Supplementary Note 1-12], wherein the two second n-type low concentration regions (58 and 59) are formed in a region directly below the second sidewalls (57).

Supplementary Note 1-14

The semiconductor device of any one of [Supplementary Note 1-8] to [Supplementary Note 1-10], wherein, in the surface layer region of the first p-type region (41), two first n-type low concentration regions (48 and 49) having a lower n-type impurity concentration than both of the first n-type source region (42) and the first n-type drain region (43) are disposed between the first n-type source region (42) and the first polysilicon gate (46) and between the first n-type drain region (43) and the first polysilicon gate (46), and the first channel region (45) is formed in a region between the two first n-type low concentration regions (48 and 49).

Supplementary Note 1-15

The semiconductor device of [Supplementary Note 1-14], further comprising:

first sidewalls (47) made of an insulating material and configured to cover both sides of the first polysilicon gate (46).

Supplementary Note 1-16

The semiconductor device of [Supplementary Note 1-15], wherein the two first n-type low concentration regions (48 and 49) are formed in a region directly below the first sidewalls (57).

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the contents of the disclosures. The accompanying claims and their equivalents are intended to cover such forms or modifications as would fall within the scope and contents of the disclosures.

What is claimed is:

1. An enhancement type MOSFET, comprising:

a semiconductor layer having a first main surface on one side and a second main surface on another side, and having a p-type region in a surface layer region on the side of the first main surface;

a n-type source region and an n-type drain region formed at an interval from each other in a surface layer region of the p-type region;

a channel region formed between the n-type source region and the n-type drain region;

a gate insulating file disposed on the channel region; and a polysilicon gate formed on the gate insulating film, wherein at least a main portion of the polysilicon gate is made of non-doped polysilicon.

2. The enhancement type MOSFET of claim 1, wherein the channel region contains an n-type impurity.

3. The enhancement type MOSFET of claim 2, wherein the polysilicon gate includes n-type portions formed on both sides of the polysilicon gate and made of n-type polysilicon.

4. The enhancement type MOSFET of claim 2, wherein, in the surface layer region of the p-type region, two n-type low concentration regions having a lower n-type impurity concentration than both of the n-type source region and the n-type drain region are disposed between the n-type source region and the polysilicon gate and between the n-type drain region and the polysilicon gate, and the channel region is formed in a region between the two n-type low concentration regions.

5. The enhancement type MOSFET of claim 4, further comprising:

sidewalls made of an insulating material and configured to cover both sides of the polysilicon gate.

6. The enhancement type MOSFET of claim 5, wherein the two n-type low concentration regions are formed in a region directly below the sidewalls.

7. A semiconductor device, comprising:

a semiconductor layer having a first main surface on one side and a second main surface on another side, and having a first p-type region and a second p-type region formed at an interval from each other in a surface layer region on the side of the first main surface;

a depletion type MOSFET; and an enhancement type MOSFET, wherein the depletion type MOSFET includes:

a first n-type source region and a first n-type drain region formed at an interval from each other in a surface layer region of the first p-type region;

a first channel region formed between the first n-type source region and the first n-type drain region;

a first gate insulating film disposed on the first channel region; and a first polysilicon gate formed on the first gate insulating film and containing a p-type impurity, wherein the enhancement type MOSFET includes:

a second n-type source region and a second n-type drain region formed at an interval from each other in a surface layer region of the second p-type region;

a second channel region formed between the second n-type source region and the second n-type drain region and having the same impurity concentration as an impurity concentration of the first channel region;

a second gate insulating film disposed on the second channel region; and a second polysilicon gate formed on the second gate insulating film, and wherein at least a main portion of the second polysilicon gate is made of non-doped polysilicon.

8. The semiconductor device of claim 7, wherein the polysilicon gate includes n-type portions formed on both sides of the polysilicon gate and made of n-type polysilicon.

9. The semiconductor device of claim 7, wherein, in the surface layer region of the second p-type region, two second n-type low concentration regions having a lower n-type impurity concentration than both of the second n-type source region and the second n-type drain region are disposed between the second n-type source region and the second polysilicon gate and between the second n-type drain region and the second polysilicon gate, and the second channel region is formed in a region between the two second n-type low concentration regions.

10. The semiconductor device of claim 9, further comprising:

second sidewalls made of an insulating material and configured to cover both sides of the second polysilicon gate.

11. The semiconductor device of claim 10, wherein the two second n-type low concentration regions are formed in a region directly below the second sidewalls.

12. The semiconductor device of claim 7, wherein, in the surface layer region of the first p-type region, two first n-type low concentration regions having a lower n-type impurity concentration than both of the first n-type source region and the first n-type drain region are disposed between the first n-type source region and the first polysilicon gate and between the first n-type drain region and the first polysilicon gate, and the first channel region is formed in a region between the two first n-type low concentration regions.

13. The semiconductor device of claim 12, further comprising:

first sidewalls made of an insulating material and configured to cover both sides of the first polysilicon gate.

14. The semiconductor device of claim 13, wherein the two first n-type low concentration regions are formed in a region directly below the first sidewalls.

* * * * *